United States Patent [19]
Ishida

[11] Patent Number: 5,995,321
[45] Date of Patent: *Nov. 30, 1999

[54] CARRIAGE STRUCTURE FOR DISK DEVICE

[75] Inventor: Katsuaki Ishida, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/889,315

[22] Filed: Jul. 8, 1997

Related U.S. Application Data

[62] Division of application No. 08/742,974, Nov. 1, 1996.

[30] Foreign Application Priority Data

Nov. 2, 1995 [JP] Japan ................................. 7-286085
Nov. 2, 1995 [JP] Japan ................................. 7-286179

[51] Int. Cl.⁶ ............................ G11B 5/48; G11B 5/50
[52] U.S. Cl. ............................ 360/97.01; 360/108
[58] Field of Search ........................ 360/97.01, 97.03, 360/98.01, 104, 106, 108

[56] References Cited

U.S. PATENT DOCUMENTS

| | | | |
|---|---|---|---|
| 557,050 | 10/1896 | Casey | 360/106 |
| 5,095,396 | 3/1992 | Putnam et al. | 360/106 |
| 5,161,074 | 11/1992 | Forbord et al. | 360/97.01 |
| 5,191,404 | 3/1993 | Wu et al. | 257/724 |
| 5,262,351 | 11/1993 | Bureau et al. | 437/183 |
| 5,270,887 | 12/1993 | Edwards et al. | 360/97.03 |
| 5,306,670 | 4/1994 | Mowatt et al. | 437/209 |
| 5,317,801 | 6/1994 | Tanaka et al. | 29/830 |
| 5,331,486 | 7/1994 | Hachiya et al. | 360/97.01 |
| 5,361,491 | 11/1994 | Oomachi et al. | 29/852 |
| 5,375,021 | 12/1994 | Boeckner | 360/97.01 |
| 5,400,195 | 3/1995 | Morii et al. | 360/97.01 |
| 5,539,595 | 7/1996 | Beck et al. | 360/97.01 |
| 5,541,788 | 7/1996 | Ishida et al. | 360/98.01 |
| 5,550,694 | 8/1996 | Hyde | 360/104 |
| 5,555,619 | 9/1996 | Maggio et al. | 29/860 |
| 5,583,720 | 12/1996 | Ishida et al. | 360/97.01 |
| 5,631,788 | 5/1997 | Richards | 360/104 |
| 5,644,452 | 7/1997 | Cox et al. | 360/106 |

FOREIGN PATENT DOCUMENTS

| | | |
|---|---|---|
| 0344366A1 | 12/1989 | European Pat. Off. . |
| 2-064972 | 3/1990 | Japan . |
| 2-177013 | 7/1990 | Japan . |
| 2177075 | 7/1990 | Japan . |
| 3250470 | 11/1991 | Japan . |
| 554622 | 3/1993 | Japan . |
| 5079360 | 4/1993 | Japan . |

*Primary Examiner*—William J. Klimowicz
*Attorney, Agent, or Firm*—Greer, Burns & Crain Ltd.

[57] ABSTRACT

In a disk device including, on a base, at least one recording disk rotated by a spindle motor, a carriage equipped with heads for executing read/write operations with the recording disk and a voice coil motor for driving the carriage, whereby the carriage includes an arm portion for mounting the heads at a distal end thereof, a main body equipped with a rotary shaft and a rotor portion serving as a rotor of the voice coil motor, the present invention provides a carriage structure capable of reducing noise and accomplishing a high transfer rate. According to the first embodiment, an anchor member comprising a flat sheet portion and an extension portion and made of a sheet metal is disposed on the flat surface portion of the side surface of the carriage main body, and a flexible circuit board is wound on the anchor member and is, in this state, connected to the carriage. Therefore, a package area on the carriage side can be increased. According to the second embodiment, a control IC of a bare chip is packaged to a connection portion of the flexible circuit board and the carriage by a flip packaging method, and other chip components are packaged by a surface packaging technology. According to the first and second embodiments, the space at which the head IC, the servo IC and the peripheral circuits are disposed integratedly can be secured at the connection portion of the flexible circuit board with the carriage. Therefore, the noise at the time of read/write by the heads can be reduced and a transfer rate can be improved while heat radiation by the components can be taken into consideration.

9 Claims, 19 Drawing Sheets

Fig.6A
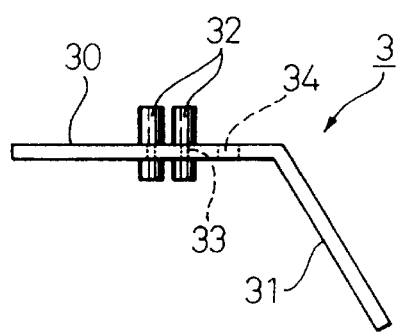
Fig.6B
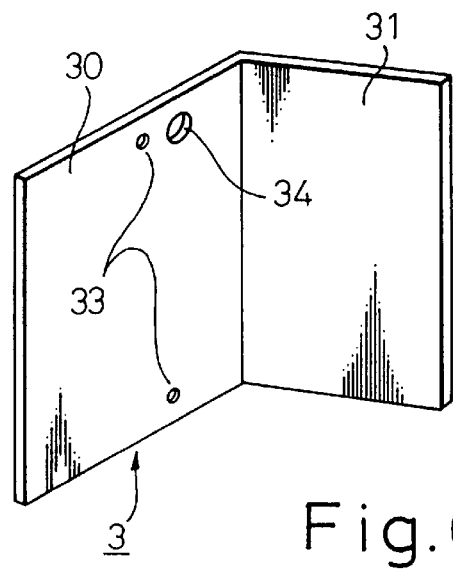
Fig.6D
Fig.6C
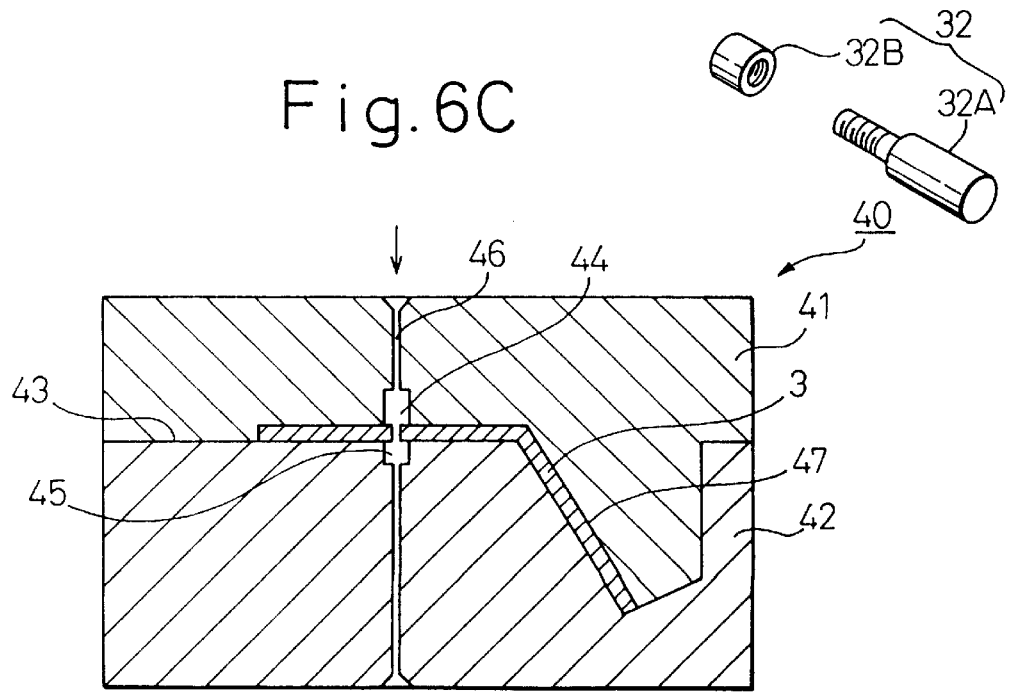

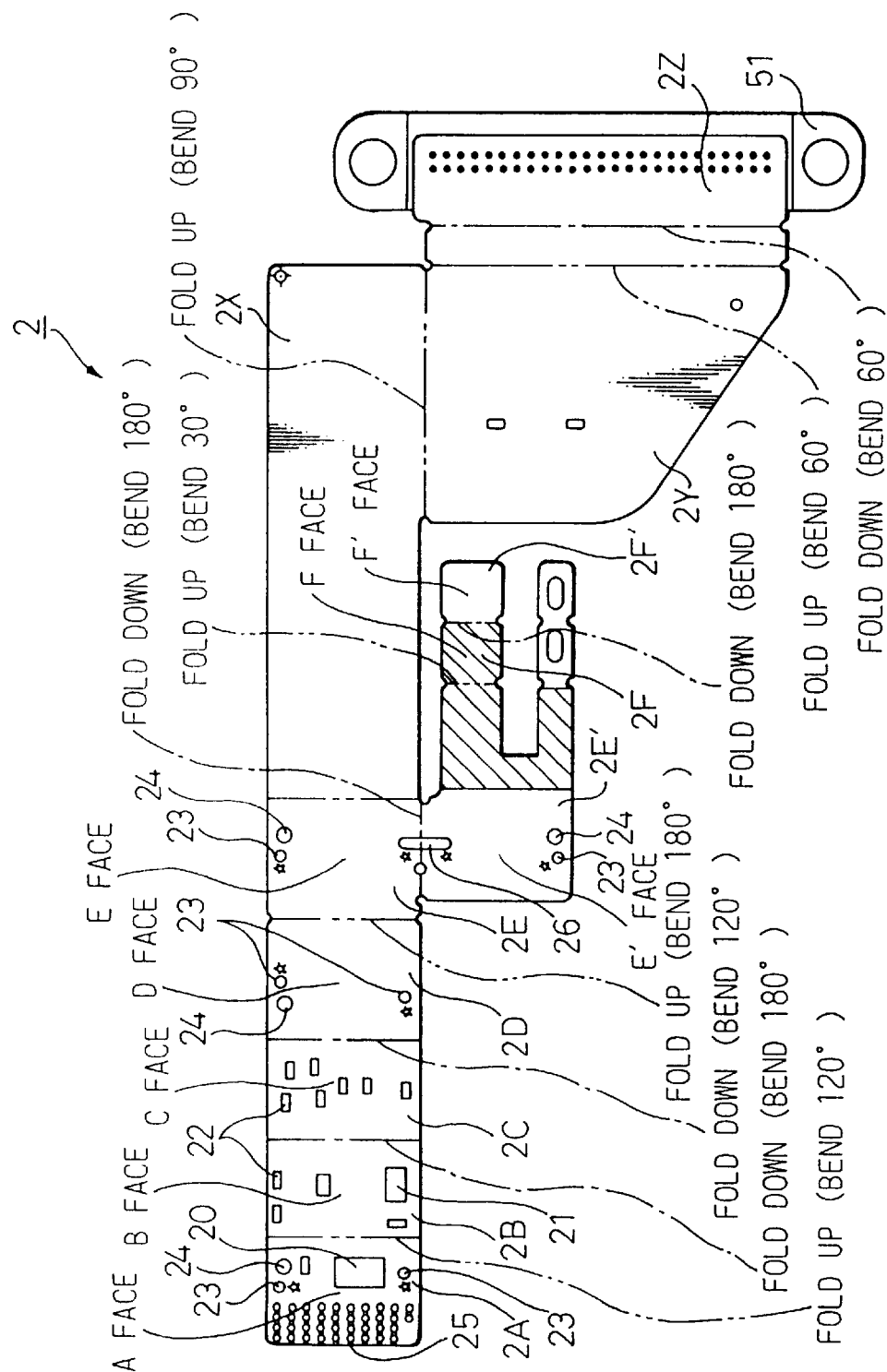

CARRIAGE STRUCTURE FOR DISK DEVICE

This is a divisional of application Ser. No. 08/742,974 filed on Nov. 1, 1996 pending.

BACKGROUND OF THE INVENTION

1. Field of the Invention

This invention relates to a carriage structure for a disk device. More particularly, this invention relates to the structure of a carriage having mounted thereon control ICs such as an IC for processing head signals to be exchanged with heads, a servo IC, and so forth.

2. Description of the Related Art

Disk devices such as magnetic disk devices, optical disk devices, etc, have been used in recent years as storage devices for computers. The memory capacity of such disk devices has been increasing year after year, and a signal exchange speed between a head and a control circuit of a disk device has also increased. Therefore, adverse influences of noise on read/write signals of the head cannot be neglected.

Data recorded on a disk of a disk device is read through a head, and writing of data to the disk is done through the head. An IC for processing read/write signals of the head (hereinafter called merely the "head IC") amplifies the data signal read by the head and controls the write operation of the data to the disk through the head, while a servo IC controls positioning of the head on the disk.

However, there is not sufficient space to mount the head IC, the servo IC and other necessary devices and components on the carriage even when a head IC and a servo IC of the smallest size available at present are used. Therefore, the head IC, the servo IC and their peripheral circuits are fixed in many cases on the base of the disk device at present. A structure capable of fixing the head IC, the servo IC and their peripheral circuits at positions in the proximity of the carriage has been therefore required.

SUMMARY OF THE INVENTION

It is an object of the present invention to provide a carriage structure capable of mounting control ICs such as a head IC and a servo IC on a carriage by devising a novel carriage structure constituting a head actuator in order to reduce the noise at the time of read/write operations of a head and to accomplish a higher signal transfer rate.

According to one aspect of the present invention, an anchor member made of sheet metal and comprising a flat sheet portion which comes into contact with a flat surface portion on the side surface of a carriage main body and an extension portion not coming into contact with the flat surface portion is disposed on this flat surface portion. A flexible circuit board connected to a carriage so as to take out signal lines connected to each head is connected to the carriage through this anchor member. Therefore, a packaging area on the carriage side can be increased, and a head IC, a servo IC and their peripheral circuits can be packaged to the connection portion of the flexible circuit board with the carriage while heat radiation is taken into account. As a result, the noise at the time of the read/write operations of the head can be reduced, and a signal transfer rate can be improved.

According to the second aspect of the present invention, a control IC for a bare chip is packaged to the connection portion of the flexible circuit board, which is to be connected to the carriage, by a novel packaging method called a "flip chip packaging method", and other chip components are packaged by a surface packaging technology. According to this means, a space in which the head IC, the servo IC and the peripheral circuits are disposed integratedly, can be secured at the connection portion of the flexible circuit board with the carriage, and these components can be packaged with a reduced number of fitting steps and under the state where heat radiation is taken into consideration. As a result, the noise at the time of the read/write operations of the head can be reduced, and the signal transfer rate can be improved.

BRIEF DESCRIPTION OF THE DRAWINGS

The present invention will be more clearly understood from the description as set forth below with reference to the accompanying drawings, wherein:

FIG. 6A is a plan view of an FPC holder to be fitted to the side surface of a main body of the carriage shown in FIG. 5;

FIG. 6B is a perspective view of a sheet metal single body that constitutes the FPC holder;

FIG. 6C is a sectional view of a mold and is useful for explaining a production example of the FPC holder;

FIG. 6D is an assembly perspective view showing another example of a pin to be fitted to the FPC holder;

FIG. 7 is a plan view showing the structure of the flexible circuit board used in the present invention;

DESCRIPTION OF THE PREFERRED EMBODIMENTS

Before describing the preferred embodiments, an explanation will be given on the conventional structure of a carriage shown in FIGS. 1 to 4.

Figure 1:
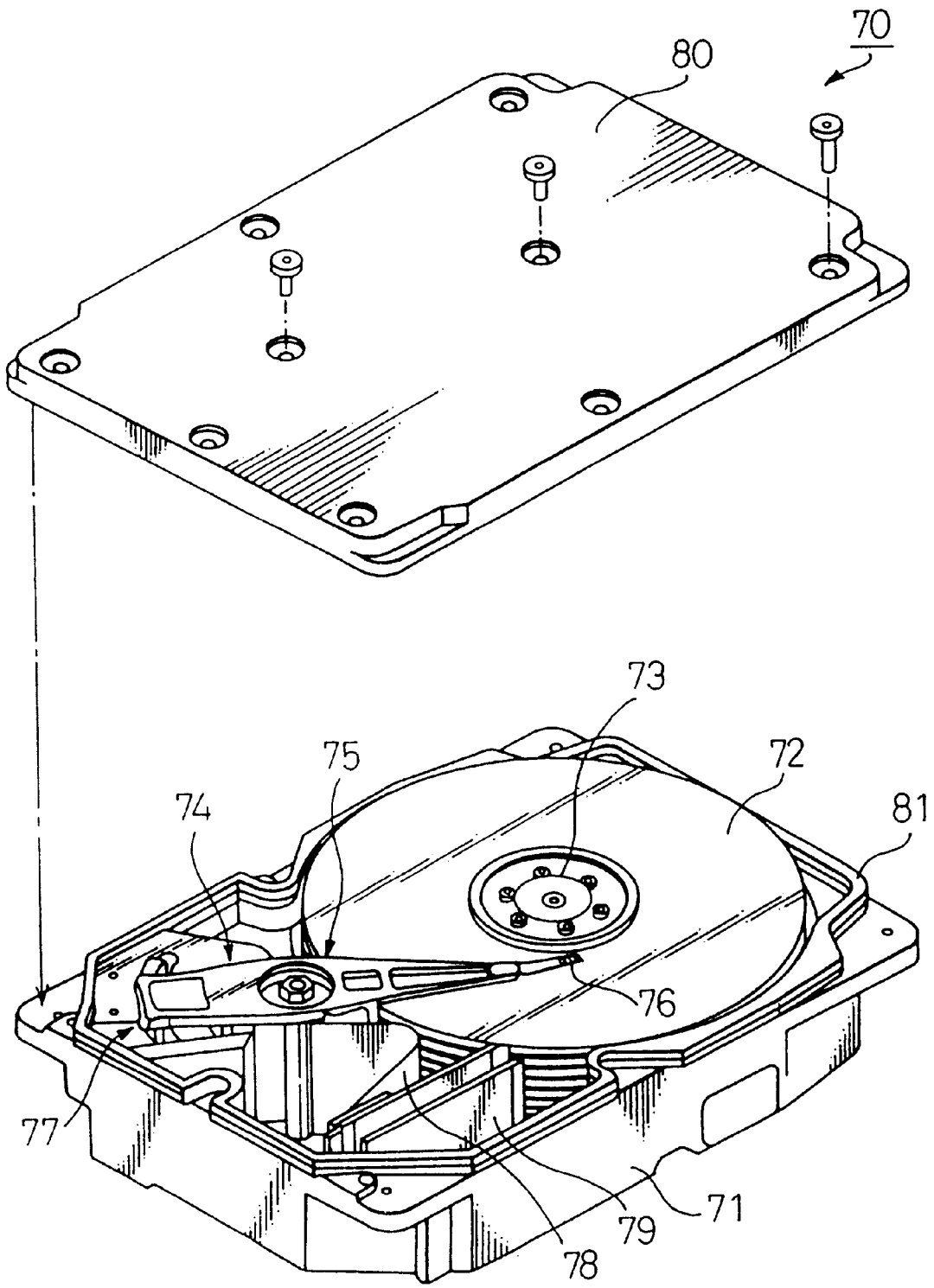
FIG. 1 is a perspective view showing an example of the construction of a magnetic disk device according to the prior art.

FIG. 1 shows the construction of a magnetic disk device 70 according to an example of the prior art. Reference numeral 71 denotes a base; 72 is a disk; 73 is a spindle motor for rotating the disk 72; 74 is an actuator comprising a carriage 75 equipped with a head at the distal end thereof and a voice coil motor 77; 80 is a cover; and 81 is a gasket interposed between the base 71 and the cover 80.

In the magnetic disk device 70 having such a construction, signals reproduced by the head 76 are taken out from the actuator 74 by a flexible circuit board 78 fitted to the side surface of the carriage 75, and are guided to a fixed substrate 79 so formed on the bottom surface of the base 71 as to protrude therefrom. A head IC and a servo IC for demodulating the read signals by the head 76 are mounted to this fixed substrate 79.

Therefore, in the conventional magnetic disk device 70 shown in FIG. 1, the noise is likely to increase at the time of read/write of the head 76, and the transfer rate cannot be increased, either. Therefore, attempts have been made to mount the head IC and the servo IC to the head actuator.

However, it is extremely difficult to mount the head IC and the servo IC to the carriage due, first, to the limitation of the space and, secondly, there is the problem of positioning when the flexible circuit board is fitted to the carriage. In the third place, the problem of exothermy of the head IC and the servo IC remains, so that cooling and heat conduction must be taken into consideration.

Figure 2:
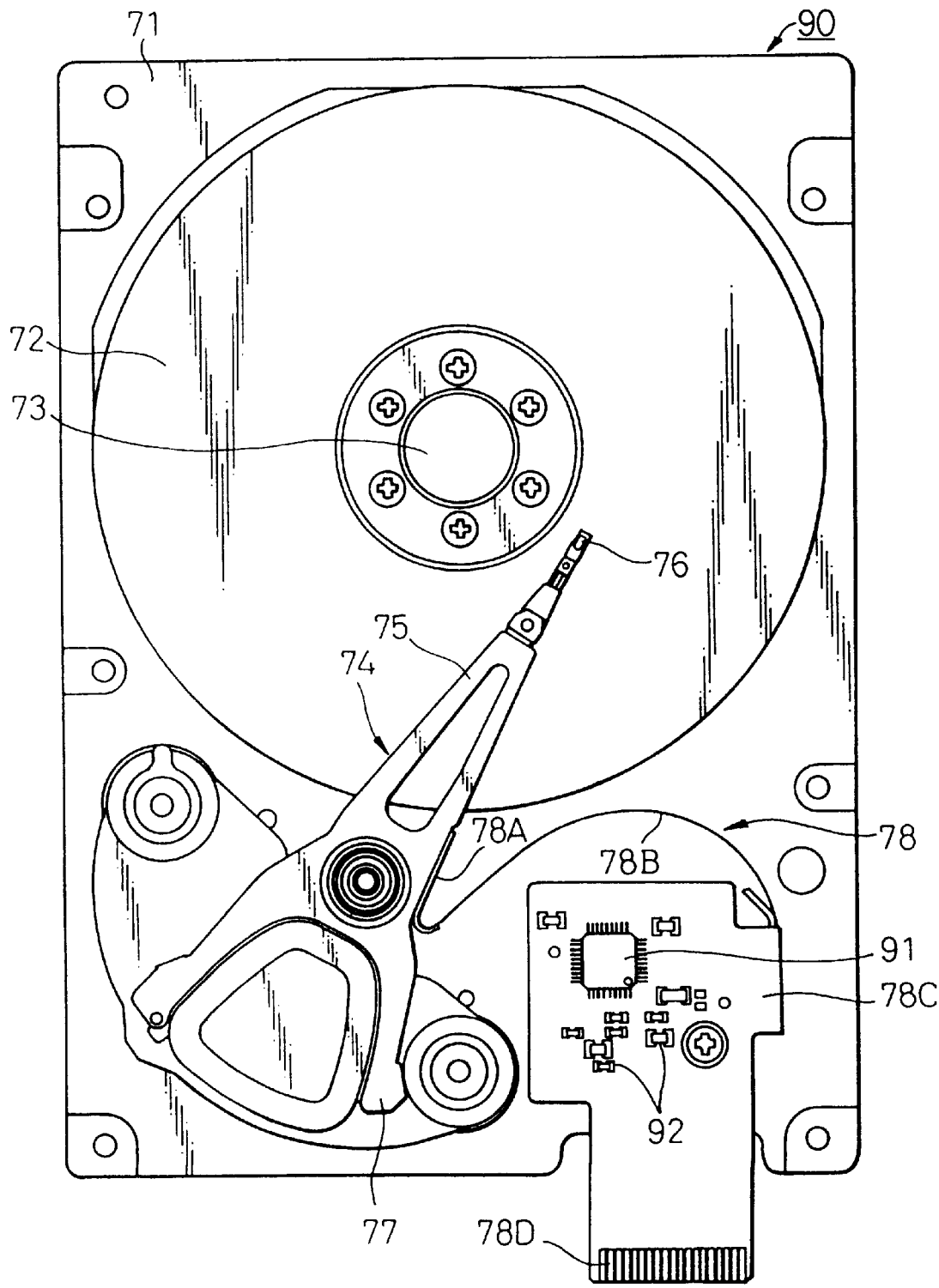
FIG. 2 is a perspective view showing another example of the construction of a magnetic disk device according to the prior art.

FIG. 2 shows another structural example of the conventional magnetic disk device 90, wherein like reference numerals are used to identify like constituent members as in the magnetic disk device 70 shown in FIG. 1. In other words, reference numeral 71 denotes the base; 72 is the disk; 73 is the spindle motor; 74 is the actuator comprising the carriage 75 equipped with the head 76 at the distal end thereof and the voice coil motor 77; and 78 is the flexible circuit board.

Figure 3A:
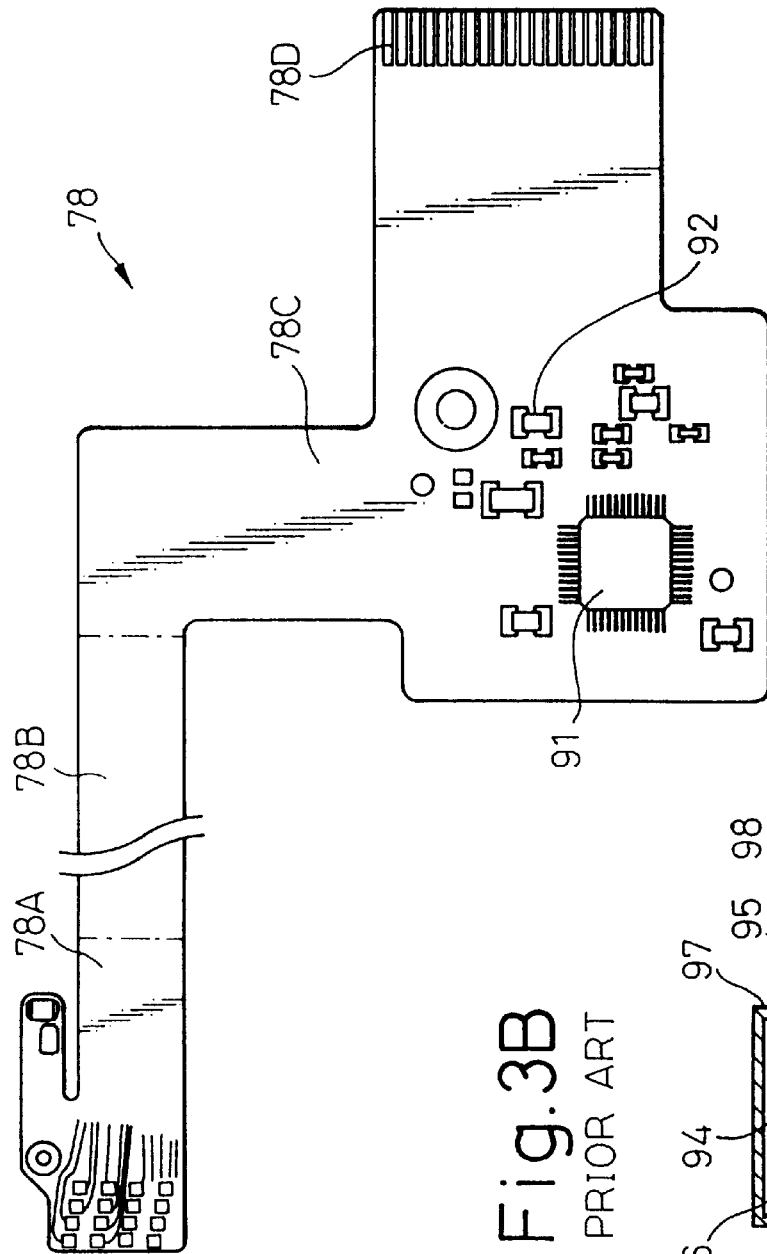
FIG. 3A is an exploded view of a flexible circuit board according to the prior art which is used for the magnetic disk device shown in FIG. 2.
Figure 3B:
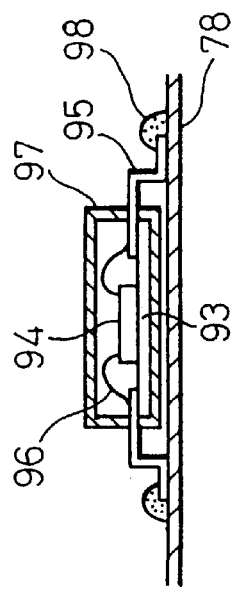
FIG. 3B is a sectional view showing the construction of a package type head IC shown in FIG. 3.

The flexible circuit board 78 used for the magnetic disk device 90 of this example comprises a movable portion (carriage mounting portion) 78A fitted to the side surface of the carriage, a bent portion 78B continuous with this movable portion 78A, a fixed portion (base portion) 78C connected at right angles to the end portion of the bent portion 78B and a connection portion 78D formed on the extension of one of the ends of the fixed portion 78C, as shown in FIG. 3A. The fixed portion 78C has a large area, and the head IC 91 for processing the signals from the head and circuit components 92 such as capacitors, resistors, etc, for forming peripheral circuits, are mounted on this fixed portion 78C. The weak signals from the head pass through the circuit pattern formed on the movable portion 78A, the bent portion 78B and the fixed portion 78C and are amplified by the head IC 91 packaged to the fixed portion 78C. The conventional head IC 91 is of the package type.

FIG. 38 is a sectional view showing the structure of the package type head IC 91 shown in FIG. 3A. A bare chip 94 is mounted to the substrate 93 of the conventional head IC 91, and pins 95 are fitted on the four sides of the substrate 93 so that the terminals on the bare chip 94 can be connected to these pins 95 by wire bonding 96. The substrate 93, the bare chip 94, the pins 95 and the wire bonding 96 are covered with a resin package 97, and the distal end of each pin 95 is connected by soldering 98 to the circuit pattern on the flexible circuit board 78.

As shown in FIG. 2, the fixed portion 78A of the flexible circuit board 78 having the construction described above is fitted to the side surface of the carriage 75, and the bent portion 78B is folded back and is pulled out from the carriage 75. Further, the fixed portion 78C is bent into a valley shape at an angle of 90° to the bent portion 78B and is fixed onto the base 71. At this time, the connection portion 78D is so arranged as to protrude from the base 71.

As described above, because the head IC for handling the signals from the head 76 is mounted on the base spaced apart from the carriage 75 in the conventional magnetic disk devices 70 and 90, the noise is likely to increase at the time of read/write of the head 76, and the transfer rate cannot be increased, either. In the prior art examples shown in FIGS. 2, 3A and 3B, the size of the bare chip itself of the head IC 91 is as small as about 4×4 mm, but when it is sealed into the package 97 and is packaged to the flexible circuit board 78 by using the pins 95, its outer size becomes as great as about 15×15 mm and requires a large space.

Therefore, attempts have been made to mount the head IC and the servo IC to the carriage 75. However, because the outer size of the head IC 91 of the package type is great as described above, it is not possible at present to secure a space for disposing such a large head IC 91 and peripheral components on the side surface of the carriage 75.

Figure 4:
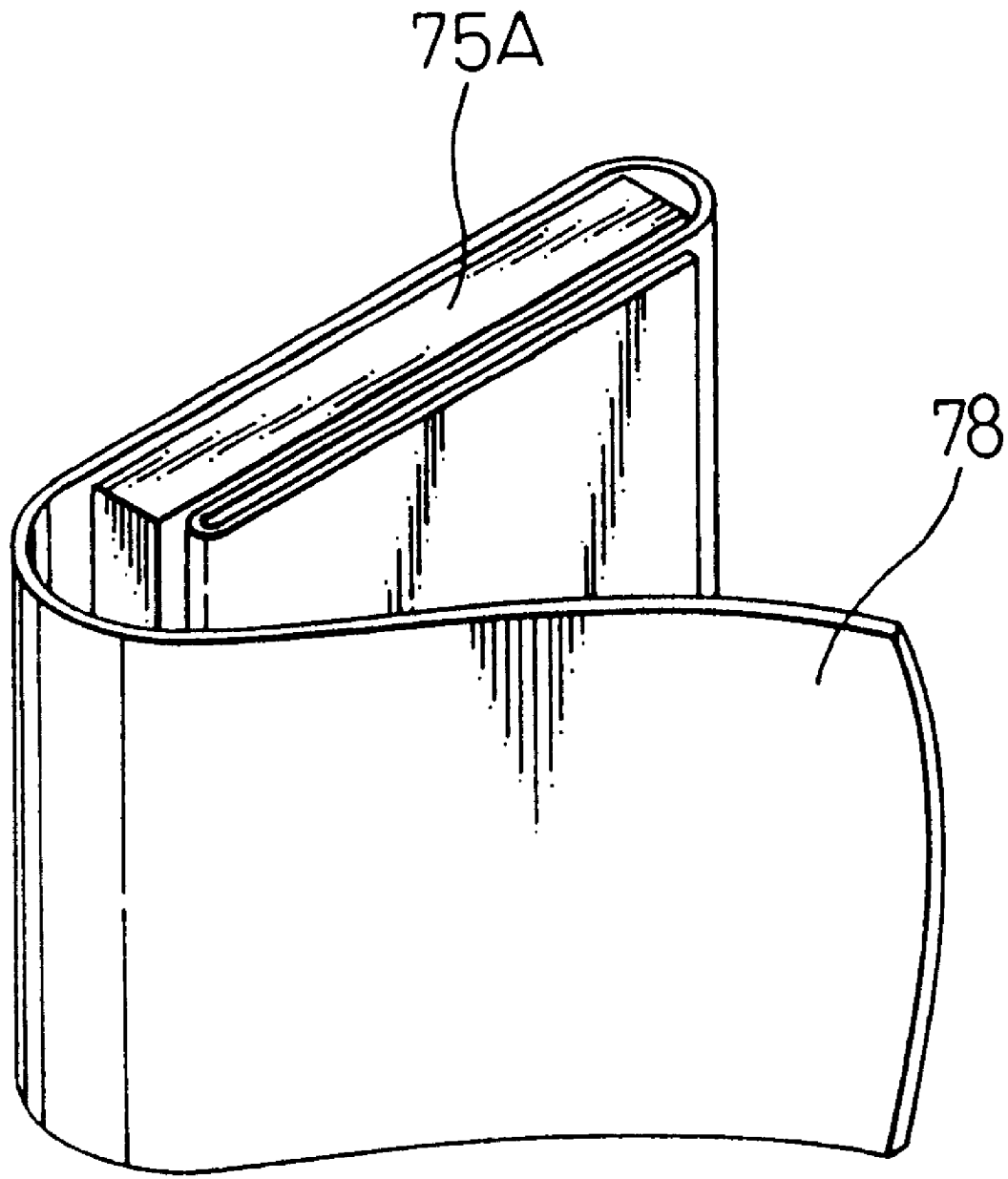
FIG. 4 is an explanatory view useful for explaining fitting a flexible circuit board to a carriage in the conventional magnetic disk device.

As an attempt to dispose a large area for fitting the head IC, etc, on the side surface of the carriage 75, a proposal has been made wherein the fitting plate 75A of the flexible circuit board is disposed on the carriage, and the flexible circuit board 78 whose distal end side is once folded back is wound on this fitting plate 75A so as to secure the space for packaging the head IC, the servo IC and the components constituting the peripheral circuit on the carriage side, as shown in FIG. 4.

According to the construction of this proposal, however, it is difficult to package the head IC and the servo IC onto the flexible circuit board, and when the head IC, the servo IC and the peripheral circuit are packaged on the flexible circuit board, the exothermy is remarkable. Because the flexible circuit board must be subjected in advance to the bending work and must be then wound on the fitting plate, the number of man-hours for fitting is great and the cost of production increase.

Figure 5:
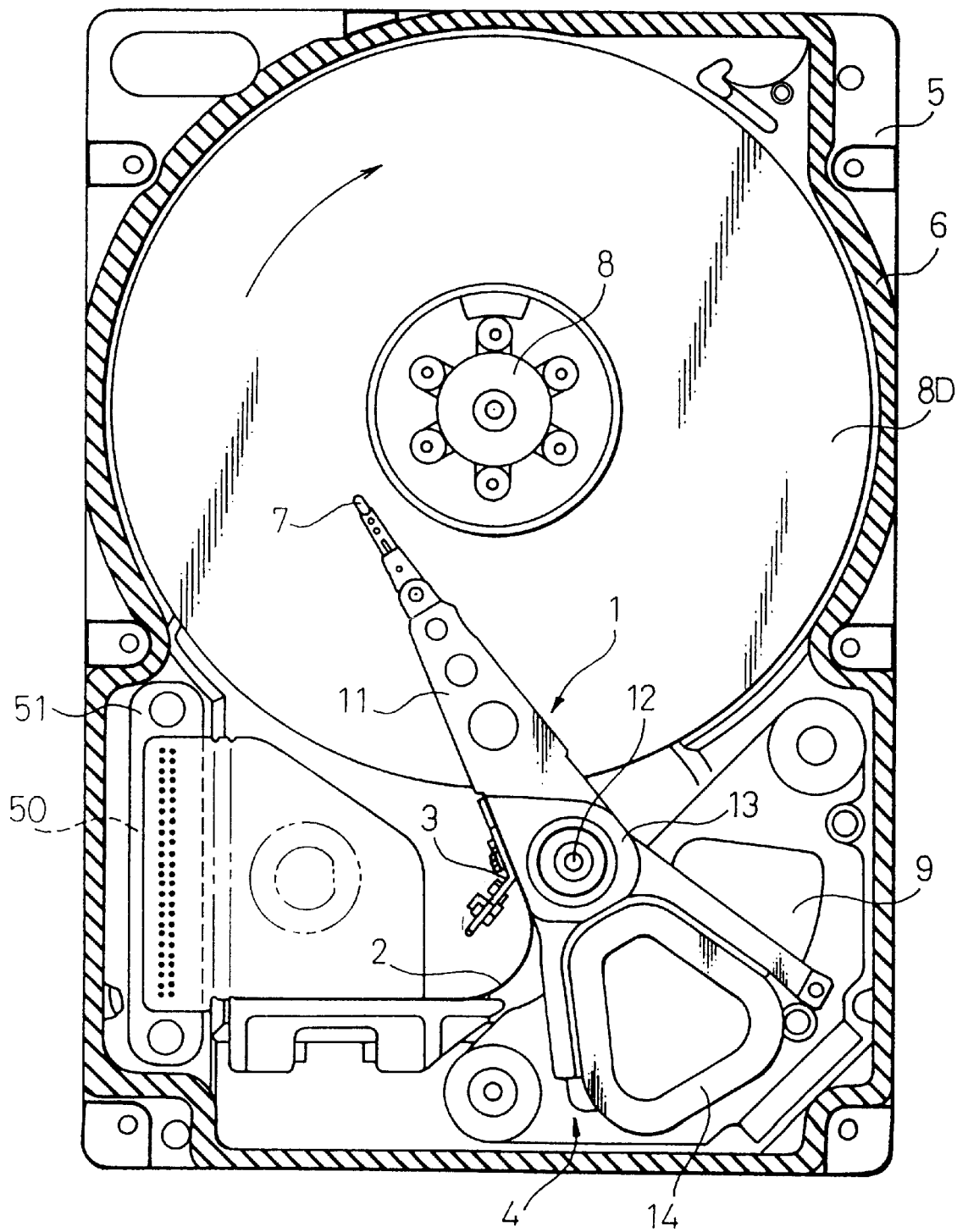
FIG. 5 is a plan view of a magnetic disk device employing a carriage structure according to the first embodiment of the present invention.

FIG. 5 shows a magnetic disk device 10, to which the carriage structure according to one embodiment of the present invention is applied, under the state where its cover is removed. The carriage 1 for mounting the head 7, the actuator 4 equipped with the voice coil motor 9 and the spindle motor 8 having the disk 8D fitted thereto are disposed on the base 5.

The carriage 1 comprises the arm portion 11 for mounting the head 7 at the distal end thereof, the carriage main body 13 equipped with a rotary shaft 12 and a rotor portion 14 as the rotor of the voice coil motor 9. One of the ends of the flexible circuit board 2 is fixed to the side surface of the carriage 1 by a flexible print circuit board holder 3 (hereinafter called the "FPC holder 3") as an anchor member. A connector 51 is disposed at the other end of the flexible circuit board 2, and is fixed to a through hole 50 on the base 5. This base is coupled with the cover 6 through a gasket 6.

In the magnetic disk device 10 having the construction described above in this embodiment, the head IC and the servo IC for demodulating the read signals from the head 7 and the peripheral circuits formed into a chip are disposed at the portion wound on the FPC holder 3 at the distal end of the flexible circuit board 2. This detailed construction will be explained with reference to FIGS. 5 to 10B.

FIG. 6A shows the FPC holder 3 fitted to the carriage 1 of the magnetic disk device 10 shown in FIG. 5, and FIG. 6B shows only a sheet metal constituting the FPC holder 3. The FPC holder 3 comprises a flat sheet portion 30 fitted to the carriage 1 and an extension portion 31. In this embodiment, the extension portion 31 is shaped as a slant sheet portion 31 bent from the flat sheet portion 30. Through-holes 33 for fitting protrusively pins and a screw hole 34 for fitting this FPC holder 3 to the carriage 1 are bored in the flat sheet portion 30. In this embodiment, two pins 32 are disposed on both surfaces of the flat sheet portion 30 so as to make the fitting work of the flexible circuit board 2 to the FPC holder 3 easy. The pins 32 can be produced by molding a resin material.

The reason why two pins 32 are disposed is to improve the assembling property by using them as the reference positions when the flexible circuit board 2 is fitted to the FPC holder 3. Rigidity of the molded pins 32 can be improved by disposing the through-holes 33 in the FPC holder 3 and fitting protrusively the pins 32 at the same position on both sides of each through-hole 33 under the connected state through the through-hole 33. In this way, even a small mold pin 32 can secure sufficient strength.

In the FPC holder 3 having the construction described above, the surface on the bending side of the slant sheet portion 31 is the surface which is far from the carriage and is the side exposed to the outside. Therefore, the surface of the FPC holder 3 positioned outside when the FPC holder 3 is fitted to the carriage 1 will be hereinafter called the "surface", and the surface of the FPC holder 3 on the fitting side to the carriage 1 will be hereinafter called the "back surface".

FIG. 6C shows an example of the method of forming protrusively the pin 32 by molding the resin material to the FPC holder 3 consisting only of the sheet metal shown in FIG. 6B. In this example, a mold 40 comprising an upper mold 41 and a lower mold 42 is prepared. A cavity 47 which accepts the FPC holder 3 of only the sheet metal is formed on a parting line 43 of this upper mold 41. A cavity 44 of the pin corresponding to the through-hole 3 when the FPC holder 3 is fitted into this cavity 47 is formed in the upper mold 41, and a cavity 45 of the lower mold of the pin is formed in the lower mold 42. The cavities 44 and 45 are greater than the diameter of the through-hole 33. Each cavity 44, 45 is communicated with outside of the upper and lower molds 41 and 42 through a gate 46. The resin material which is superheated and molten and is in a fluidized state is charged into such a mold 40 through the gate 46 and is cooled, and then the upper and lower molds 41 and 42 are separated at the parting line 43. In this way, the FPC holder 3 having the pins 32 protruding from the flat sheet portion 30 on both of its sides can be completed as shown in FIG. 6A. Since the pins 32 protruding to both sides of the flat sheet portion 30 are formed integrally through the through-holes 33 having a smaller diameter than that of the pins 32, the pins 32 do not fall off from the flat sheet portion 32.

In the example given above, the pins 32 are formed on the FPC holder 3 by resin molding, but the pins 32 may be made of a metal. In this case, a male pin 32A equipped with a male screw capable of passing through the through-hole 33 of the FPC holder 3 and a female screw 32B meshing with this male screw are prepared, and the pin 32 can be protrusively formed on the FPC holder 3 by inserting the male screw 32A through the through-hole 33 of the FPC holder 3 and then meshing it with the female screw 32B.

FIG. 7 is a plan view showing the structure of the flexible circuit board 2 used for the carriage structure according to the first embodiment. In this flexible circuit board 2, an A face 2A to be superposed with the front face of the flat sheet portion 30 of the FPC holder 3, a B face 2B to be superposed on the front surface of the slant sheet portion 31, a C face 2C to be superposed with the back surface of the flat slant portion 30, a D face 2D to be superposed with the back surface of the flat sheet portion 30 and an E face 2E to be superposed with the D face 2D are formed in order named from the free end side of the flexible circuit board 2, and a face 2X continues this E face 2E. An E' face 2E' to be superposed with the E face 2E when folded back is disposed on the side as the lower side of the E face 2E, an F face 2F and an F' face 2F' to be superposed with the F face 2F when folded back are disposed on the same side as the face 2X of this E' face 2E'. Further, a base face 2F which is parallel to the base of the magnetic disk device is connected to the end side of the face 2X. A connector connection face 2Z is formed at the end portion of this base face 2Y, and the connector 51 fixed to the through hole 50 disposed on the base 5 shown in FIG. 5 is fitted to this connector connection surface 2Z.

The head IC 20 for processing the signals from the head is packaged to the A face 2A equipped with the pin insertion holes 23 and the screw insertion holes 24 by a packaging method such as surface package technique, and the input terminals 25 for the signals from the head are disposed at the distal end portion of the A face 2A. The chip components 22 constituting the servo IC 21 and the peripheral circuit are packaged to the B face 2B, and the chip components are also packaged to the C face 2C. Further, the pin insertion holes 23 (or the pin insertion slits 26) and the screw insertion holes 24 are disposed on the D face 2D, the E face 2E and the E' face 2E' positioned on the back side of the A face 2A when fitted to the FPC holder 3 at the positions corresponding to the pins 32 and the screw holes 34, respectively.

Figure 8:
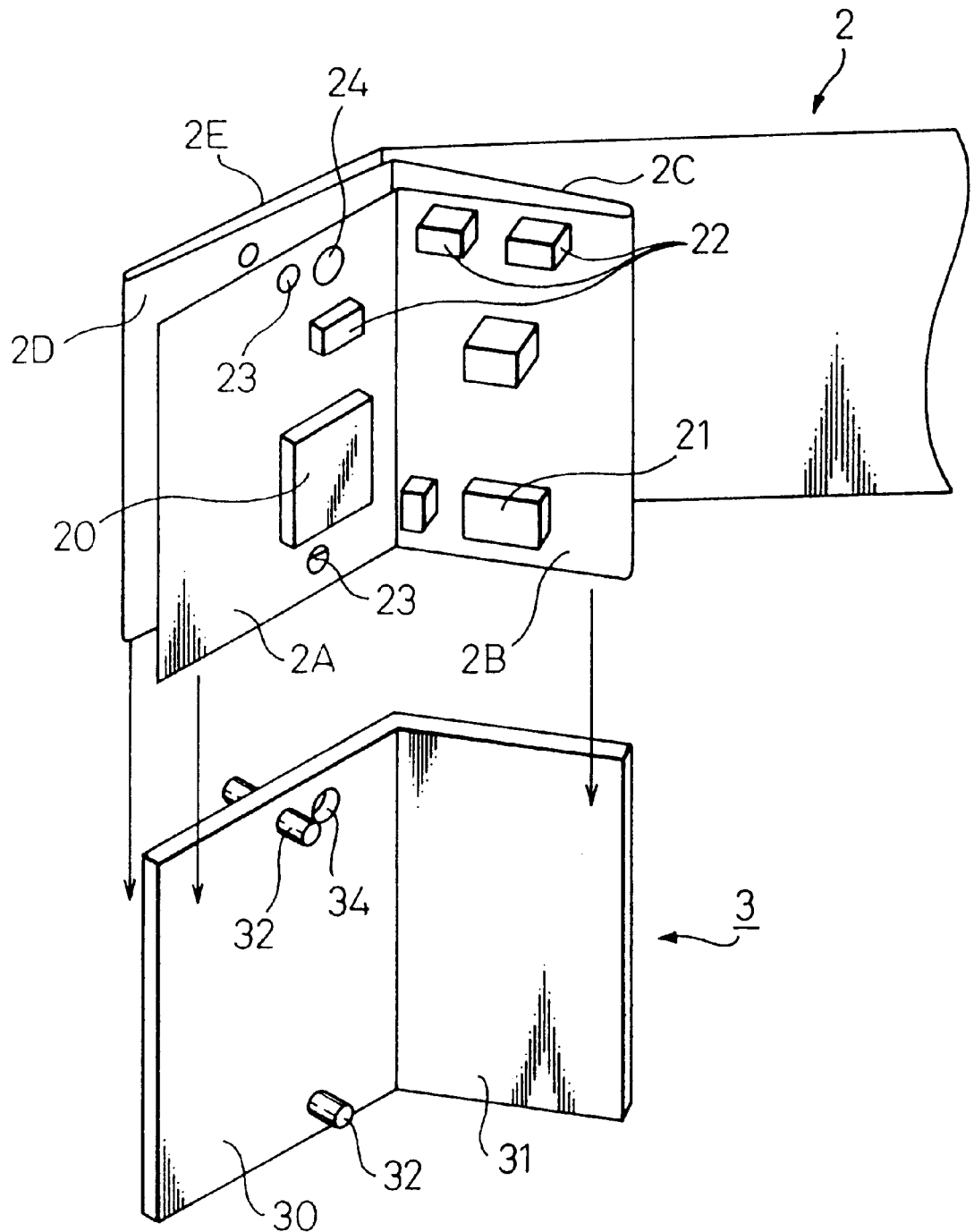
FIG. 8 is an assembly perspective view showing the mode of fitting the flexible circuit board shown in FIG. 3 to the FPC holder shown in FIG. 6A.

FIG. 8 is an assembly perspective view showing the mode of fitting the flexible circuit board 2 constructed as shown in FIG. 7 to the FPC holder 3 shown in FIG. 2. The A face 2A, the B face 2B, the C face 2C, the D face 2D, the E face 2E, the E' face 2E', the F face 2F, the F' face 2F' and the face 2X of the flexible circuit board 2 having the construction shown in FIG. 7 are folded at the folding angles and in the folding directions as shown in FIG. 7, respectively, and the A face 2A to the E face 2E are fitted in such a manner as to be wound round the FPC holder 3 as shown in FIG. 8.

Figure 9A:
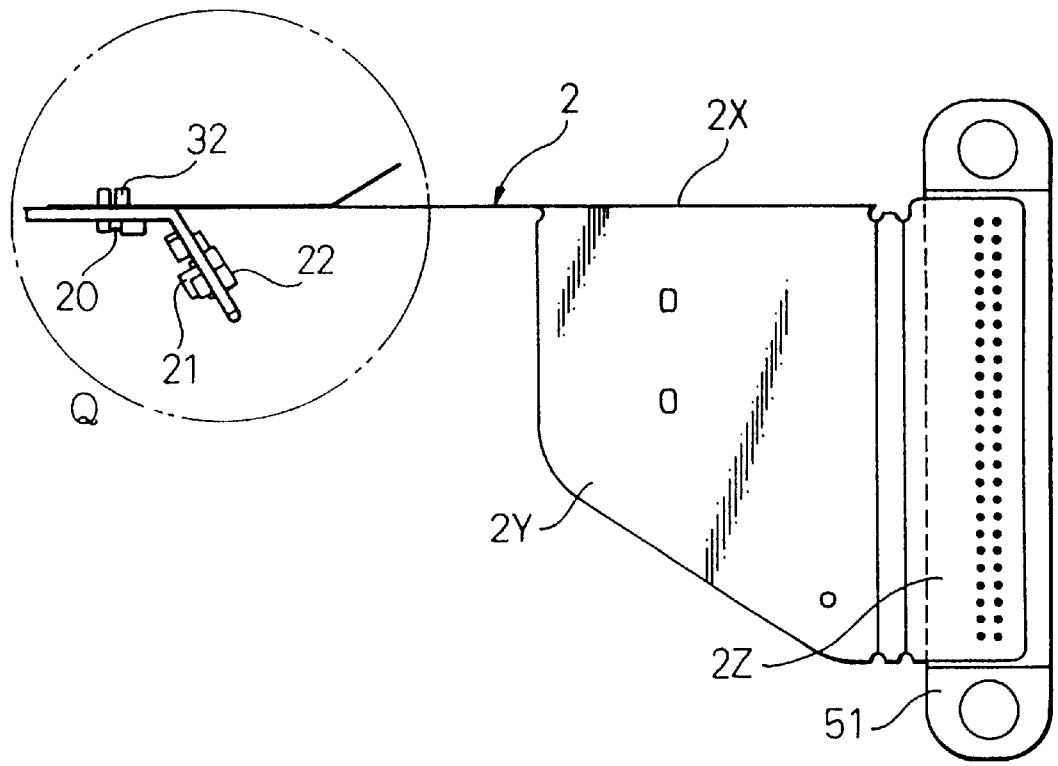
FIG. 9A is a plan view of the FPC holder under the state where the flexible circuit board is fitted.

FIG. 9A shows the state where the flexible circuit board 2 having the construction described above is fitted to the FPC holder 3, and FIG. 9B is a partial enlarged view of the Q portion of FIG. 9A.

Figure 10A:
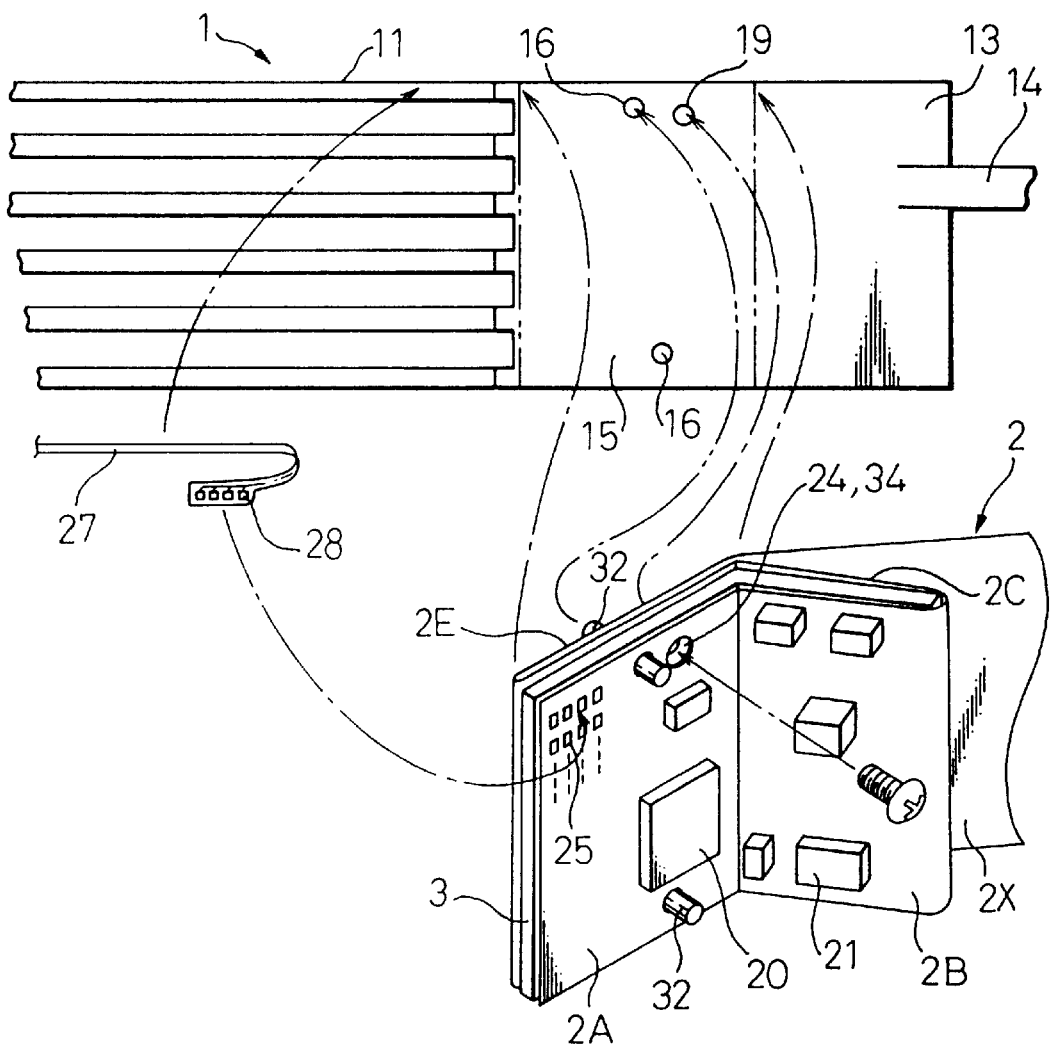
FIG. 10A is an assembly perspective view useful for explaining fitting of the FPC holder, to which the flexible circuit board is fitted, to the carriage.
Figure 10B:
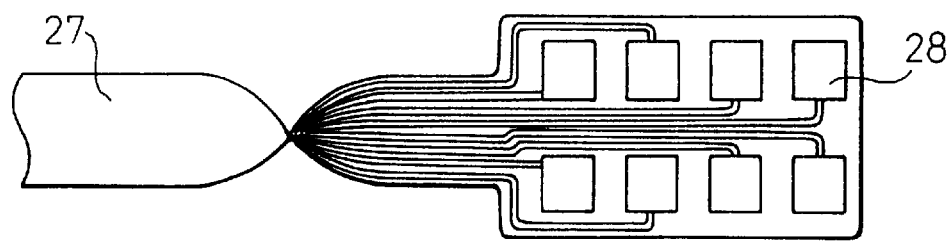
FIG. 10B is a partial enlarged view of a relay flexible circuit board fitted to the side surface of an arm portion shown in FIG. 10A.

The head IC 20, the servo IC and the chip components 22 are positioned on the FPC holder 3 made of a sheet metal as shown in FIGS. 10A and 10B. Therefore, even when these members cause exothermy, the heat is transferred by the FPC holder 3 made of the sheet metal to the carriage main body 13, and the heat radiation effect is improved. Heat conduction can be further improved by using an aluminum sheet, or the like, as the material of the FPC holder 3, and exothermy of the head IC 20, etc, can be restricted.

Figure 9B:
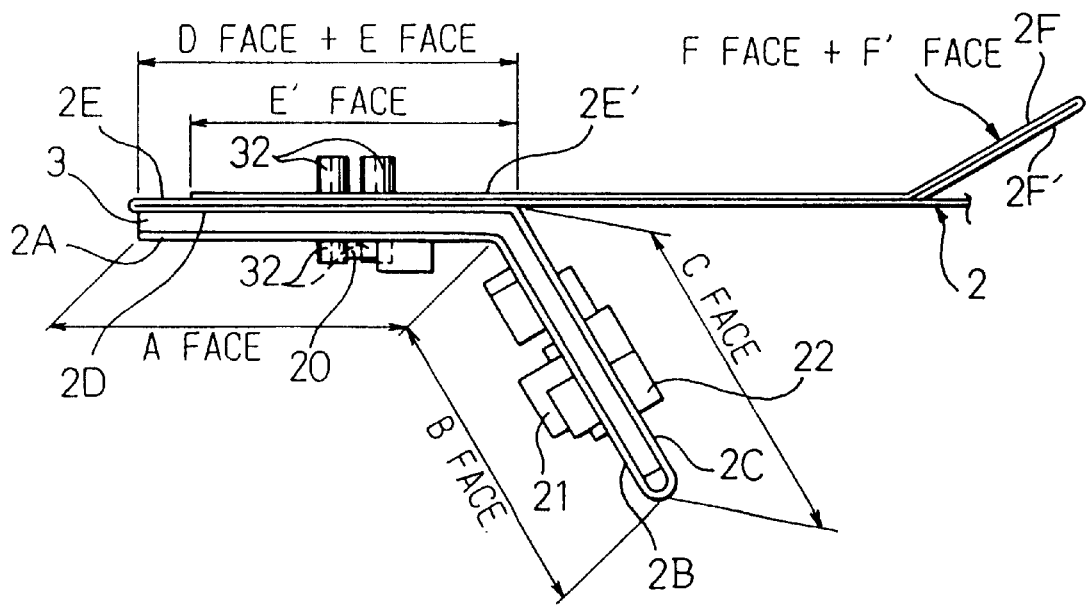
FIG. 9B is a partial enlarged view of a portion Q in FIG. 9A.

FIG. 10A explains the mode of fitting of the FPC holder 3, to which the flexible circuit board 2 is fitted as shown in FIGS. 9A and 9B, to the carriage 1. The FPC holder 3, on which the flexible circuit board 2 is wound as shown in FIGS. 9A and 9B, is positioned as the pins 32 disposed on the inner side of the FPC holder 3 are fitted into the pin holes 16 disposed on the flat surface portion 15 of the carriage main body 13, and is thus fitted to the carriage main body 13. In the state where the FPC holder 3 is fitted to the flat surface portion 15 of the carriage main body 13, the screw holes 34 of the FPC holder 3 and the screw insertion holes 24 bored in the flexible circuit board 2 coincide with the screw holes 19 formed in the flat surface portion 15 of the carriage main body 13. Therefore, the FPC holder 3 can be fixed to the carriage main body 13 by inserting the screws 29 through these holes and fastening them.

Additionally, the FPC holder 3 can be fixed to the carriage main body 13 by merely fitting the pins 32 into the pin holes 16 when the pins 32 formed protrusively on the FPC holder 3 and the pin holes 16 formed in the flat surface portion of the carriage main body 13 have a tight fit arrangement.

The connection terminals 28 disposed at the distal end portion of the relay flexible circuit board 27, which is fitted to each side surface of the arm portion 11 of the carriage 1 and exchanges the signals with each head disposed at the distal end portion of the arm portion 11, are connected to the input terminals 25 disposed at the distal end portion of the flexible circuit board 2 of the FPC holder 3 fitted to the carriage main body 13. The relay flexible circuit board 27 shown in FIG. 10A is fitted to the uppermost arm portion 11 of the carriage 1 (the number of heads fitted is one). Therefore, only one set of connection terminals 28 are disposed. On the other hand, because two heads are fitted to each arm portion 11 other than the uppermost and lowermost arm portions 11, the shape of the relay flexible circuit board 27 fitted to these arm portions 11 is shown in FIG. 10B.

The reason why four output terminals 28 are disposed at the distal end portion of each relay flexible circuit board 27 is because the head in this embodiment is a composite head equipped with an inductive head and an MR head.

Figure 11A:
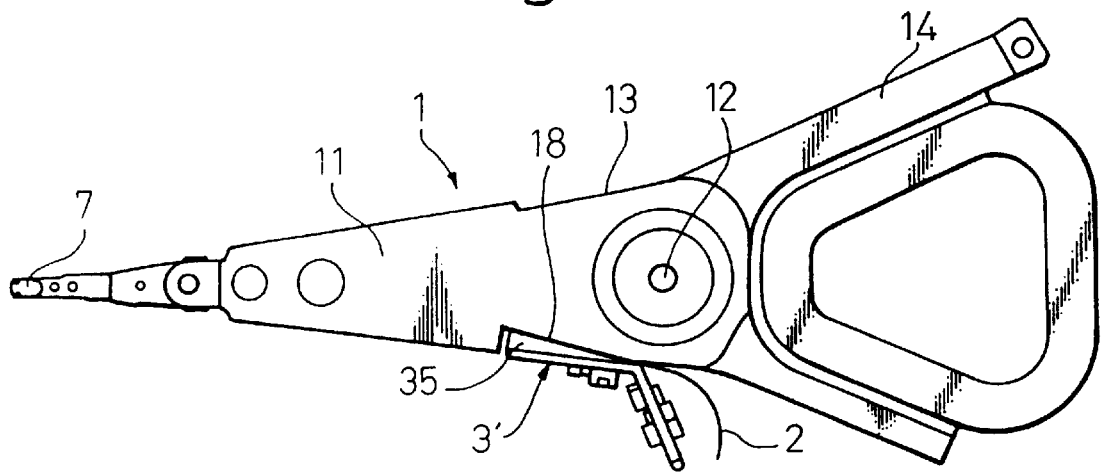
FIG. 11A is a plan view of the carriage of another example of the carriage structure according to the first embodiment of the present invention.
Figure 11B:
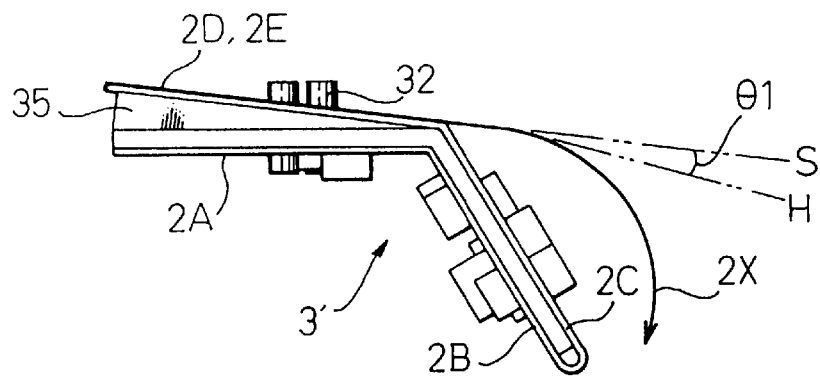
FIG. 11B is an explanatory view useful for explaining a withdrawing direction of the flexible circuit board when the FPC holder shown in FIG. 11A is used.
Figure 11C:
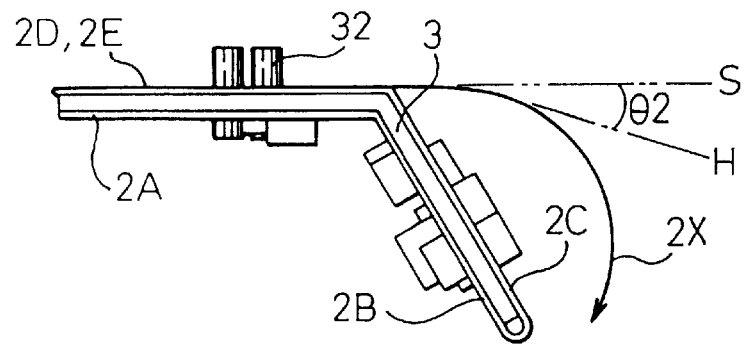
FIG. 11C is an explanatory view useful for explaining the withdrawing direction of the flexible circuit board when the FPC holder shown in FIG. 6A is used.

FIGS. 11A to 11C show another example of the carriage structure according to the first embodiment of the present invention, and FIG. 11A shows only the carriage 1 when it is taken out from the magnetic disk device. In this example, only the FPC holder 3' and the structure of the fitting surface of the main body 13 of the carriage 1 with the FPC holder 3' are different from those of the foregoing example, and the construction of the flexible circuit board 2 is entirely the same as that of the foregoing example. Therefore, only the different portions of the FPC holder 3' of this example from the foregoing example will be explained.

Figure 12A:
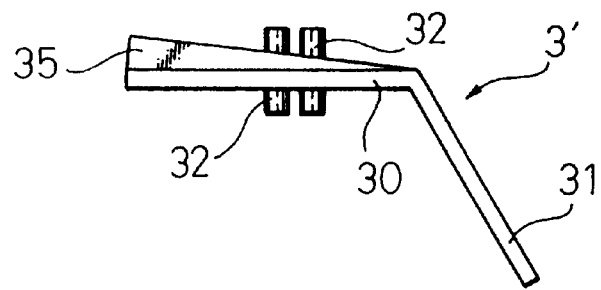
FIG. 12A is a plan view of the FPC holder to be fitted to the side surface of the main body of the carriage shown in FIG. 11.
Figure 12B:
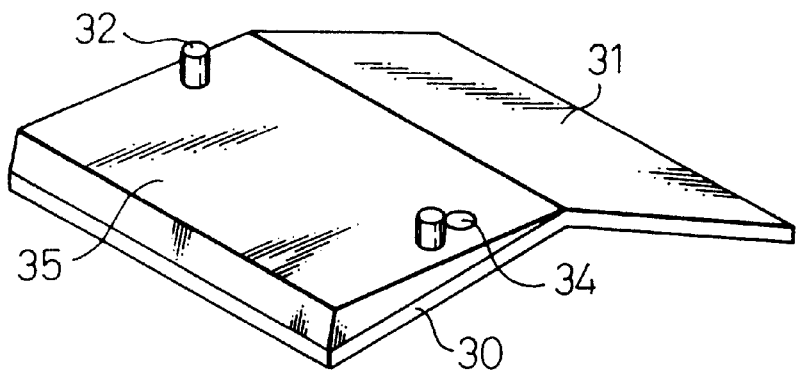
FIG. 12B is a perspective view of the FPC holder shown in FIG. 12A.

FIG. 12A shows the FPC holder 3' fitted to the carriage 1 shown in FIG. 11A, and FIG. 12B is a rear view of this FPC holder 3'. The sheet metal used for the FPC holder 3' in this example is the same as the sheet metal of the FPC holder 3 explained with reference to FIG. 6B. Therefore, the sheet metal comprises the flat sheet portion 30 to be fitted to the carriage 1 and the slant sheet portion 31 bent from this flat sheet portion 30, and the through-hole 33 for protrusively disposing the pin and the screw hole 34 for fitting the FPC holder 3' to the carriage 1 are bored in this flat sheet portion 30 (see FIG. 6B).

In the example explained with reference to FIGS. 1 to 10B, two pins 32 are protrusively formed by molding the resin material on both sides of the through-hole 33 of the flat sheet portion 30. In the example shown in FIGS. 11A to 12B, too, the pin 32 is similarly shaped by molding, and the shape of the FPC holder 3' on the surface side is exactly the same as that of the FPC holder 3 explained with reference to FIGS. 1 to 10B. On the other hand, the difference of this example shown in FIGS. 11A to 12B from the example shown in FIGS. 1 to 10B, resides in that a spacer 35 is formed by molding of a resin material on the back of the FPC holder 3' in addition to the pins 32. The spacer 35 is shaped integrally with the pins 32 by molding the resin material on the fitting surface of the carriage main body 13 of the flat sheet portion 30 of the FPC holder 3' in such a manner as to define a slope surface having a greater thickness on the free end side of the flat sheet portion 30. The pins 32 may be made of a metal, namely the spacer 35 may be formed by an insert molding of the metal pins.

Because the spacer 35 having the slope surface is formed on the flat sheet portion 30 on the back side of the FPC holder 3', a recess portion 18 for accommodating this spacer 35 is defined on the flat surface portion 15 of the carriage main body 13. The shape of this recess portion 18 is substantially the same as the shape of the spacer 35 formed on the back side of the FPC holder 3'. When the spacer 35 is accommodated in this recess portion 18 and the FPC holder 3' is fitted to the side surface of the carriage 1, the surface side of the FPC holder 3' does not protrude far from the side surface of the carriage 1.

Figure 12C:
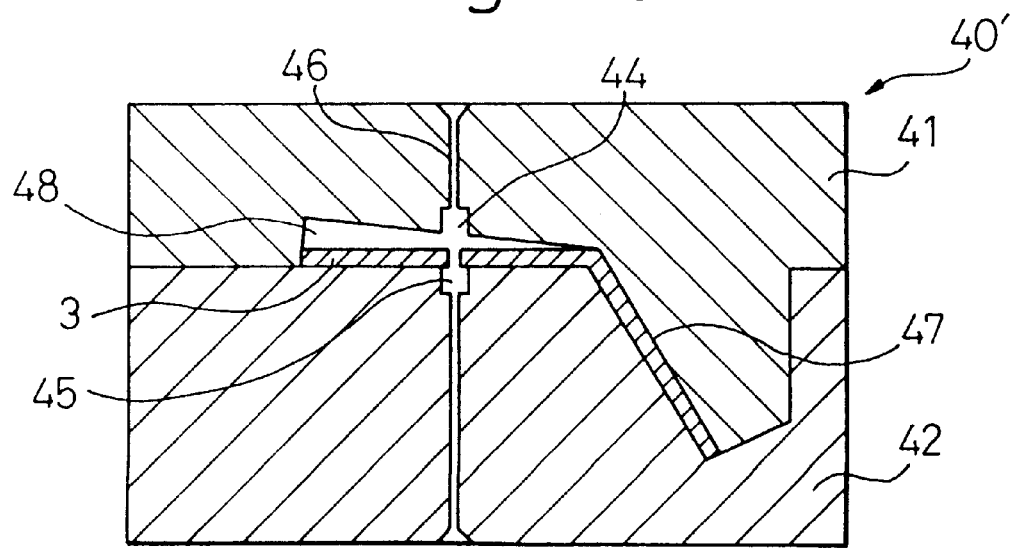
FIG. 12C is an explanatory view useful for explaining a production example of the FPC holder shown in FIG. 12A.

FIG. 12C shows an example of a method of producing the FPC holder 3' having the pins 32 and the spacer 35 formed thereon by molding the resin material for the FPC holder consisting of only the sheet metal shown in FIG. 12B. In this example, too, the mold 40' comprising the upper mold 41 and the lower mold 42 is prepared. A cavity 48 for forming the spacer 35 is disposed on the parting line 43 of the upper mold 41 in addition to the cavity 47 for accommodating the FPC holder 3 consisting of the sheet metal alone. The cavity 44 of the upper mold of the pin is formed in the upper mold 41 corresponding to the through-hole 33 when the FPC holder 3 is fitted into this cavity 47, and the cavity 45 of the lower mold of the pin is formed in the lower mold 42. This arrangement is the same as that of FIG. 6C. Each cavity 44, 45 is greater than the diameter of the through-hole 33. Each cavity 44, 45 communicates with the outside of the upper and lower molds 41 and 42 through the gate 46. The resin material which is superheated and molten and is in a fluidized state is charged into the mold 40' through the gate 46 and is thereafter cooled. When the upper mold 41 and the lower mold 42 are separated from the parting line 43, the FPC holder 3' having the pins 32 protruding on both sides of the flat sheet portion 30 and equipped with the spacer 35 on only the back of the flat sheet portion 30, as shown in FIGS. 12A and 12B, can be completed. Since each pin 32 protruding on both sides of the flat sheet portion 30 is integrally formed through the through-hole 33 having a diameter smaller than that of the pin 32, the pins 32 and the spacer 35 do not fall off from the flat sheet portion 32.

FIG. 11B shows, magnified, the connection portion of the flexible circuit board 2 of the carriage 1 when the FPC holder 3' shown in FIGS. 12A and 12B is used, and FIG. 11C shows, magnified, of the flexible circuit board 2 of the carriage 1 when the FPC holder 3 shown in FIG. 6A is used. In the case of the FPC holder 3' equipped with the spacer 35 as shown in FIGS. 11B and 11C, an angle θ1 of a line H representing a take-out angle of the face 2X of the flexible circuit board 2 with respect to a line S representing the fitting surface of the FPC holder 3' to the carriage 1 is small. In the case of the FPC holder 3 not equipped with the spacer 35, on the other hand, an angle θ2 of the line H representing the take-out angle of the face 2X of the flexible circuit board 2 to the line S representing the fitting face to the carriage 1 is greater than the angle θ1. Therefore, the angle of deviation of the proximal portion of rocking of the face 2X of the flexible circuit board 2 is smaller in the FPC holder 3' having the spacer 35, and durability of the flexible circuit board 2 is higher than the FPC holder 3 not having the spacer 35.

Though the carriage structure according to the first embodiment of the present invention has thus been described using the examples of the magnetic disk device, the structure of the first embodiment can be applied to other disk devices such as an optical disk. Further, the first embodiment provides the following advantages.

(1) The FPC holder 3 made of the bent sheet metal is fitted to the side surface of the main body 13 of the carriage 1 while the flexible circuit board 2 is wound on its periphery. In this way, the packaging area can be secured by the folded portion of the FPC holder 3, and the circuit components for processing the signals from the heads such as the head IC 20 can be packaged to the side surface of the carriage 1.

(2) To facilitate the fitting of the flexible circuit board 2 to the carriage 1, the pins 32 are formed by molding on both sides of the FPC holder 3, and are used as the reference when the flexible circuit board 2 is fitted to the FPC holder 3 as well as the reference when the FPC holder 3 is fitted to the carriage 1. Therefore, the assembly factor of the carriage 1 can be improved. At this time, the position of the mold pin 32 is situated at the same position on both surfaces of the FPC holder 3, and the through-hole 33 is bored in the sheet metal between them so as to connect the mold pins 32 on both sides. In this way, rigidity of the mold pins 32 can be improved, and even a sufficiently small mold pin 32 can secure the necessary strength.

(3) In conjunction with the problem of exothermy, heat conduction can be improved by using the sheet metal for the FPC holder 3. Heat conduction can be further improved by using aluminum, or the like, and the exothermy of the circuit components packaged to the flexible circuit board 2, which is wound on the FPC holder 3, can be restricted.

In the embodiment described above, the extension portion 31 of the FPC holder 3 is the slant sheet portion 31 bent at a predetermined angle from the flat sheet portion 30. However, the shape of the extension portion 31 is not particularly limited to this shape, and it may be a curved plate extended in such a manner as to be curved from the flat sheet portion 30.

Further, in the structure of the carriage 75 of the magnetic disk device 70 according to the prior art explained with reference to FIG. 1, positioning when the flexible circuit board 78 to the side surface of the carriage 75 is fitted becomes easy even when the structure comprising only the flat sheet portion 30 of the FPC holder 3 according to the first embodiment is employed.

As explained above, according to the carriage structure of the first embodiment, the head IC, the servo IC and the peripheral circuits can be packaged to the connection portion of the flexible circuit board with the carriage under the state which takes exothermy into consideration, the noise at the time of read/write of the head can be reduced, and the transfer rate can be improved.

Next, the carriage structure according to the second embodiment will be explained.

Figure 13:
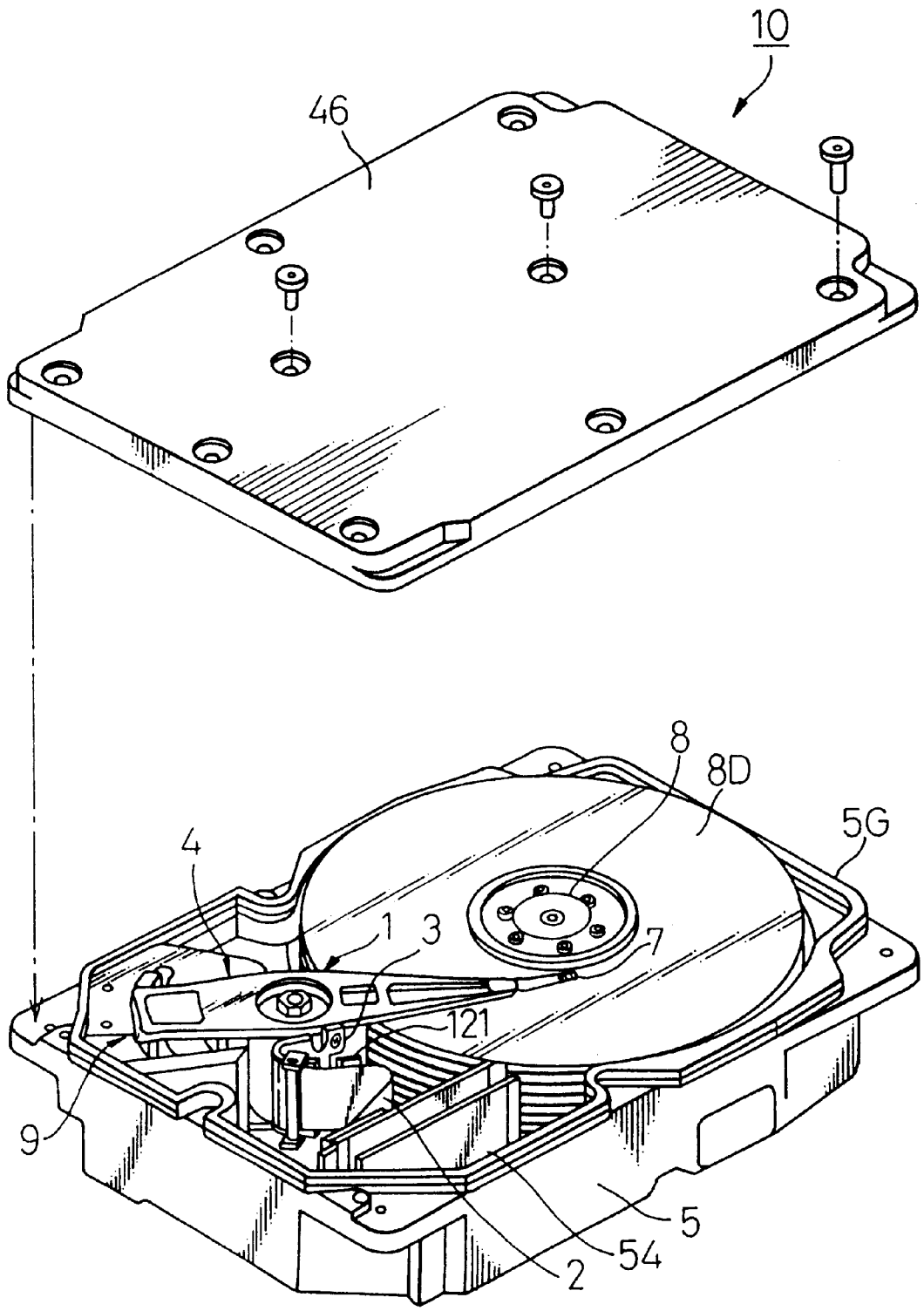
FIG. 13 is a perspective view showing the overall construction of a magnetic disk device according to the second embodiment of the present invention.

FIG. 13 shows an example of the construction of the magnetic disk device to which the carriage structure of the second embodiment of the present invention is applied. The actuator 4 equipped with the carriage 1 for mounting the head 7 and with the voice coil motor 9, the spindle motor 8 having the disk 8D fitted thereto and the fixed substrate 54 having the control circuit devices of the disk device packaged thereto are disposed on the base 5. One of the end portions of the flexible circuit board 2 is fixed to the side surface of the carriage 1, and the other end of the flexible circuit board 2 is connected to the fixed substrate 54. The base 5 is coupled with the cover 46 through the gasket 5G.

In the magnetic disk device 10 having the construction described above, the head IC 121 and the servo IC for demodulating the read signals by the head 7, and the peripheral circuit arranged into the chip, are disposed at the distal end portion of the flexible circuit board 2 fitted to the carriage 1 in this embodiment. The detailed construction will be explained with reference to FIGS. 14A to 19.

Figure 14A:
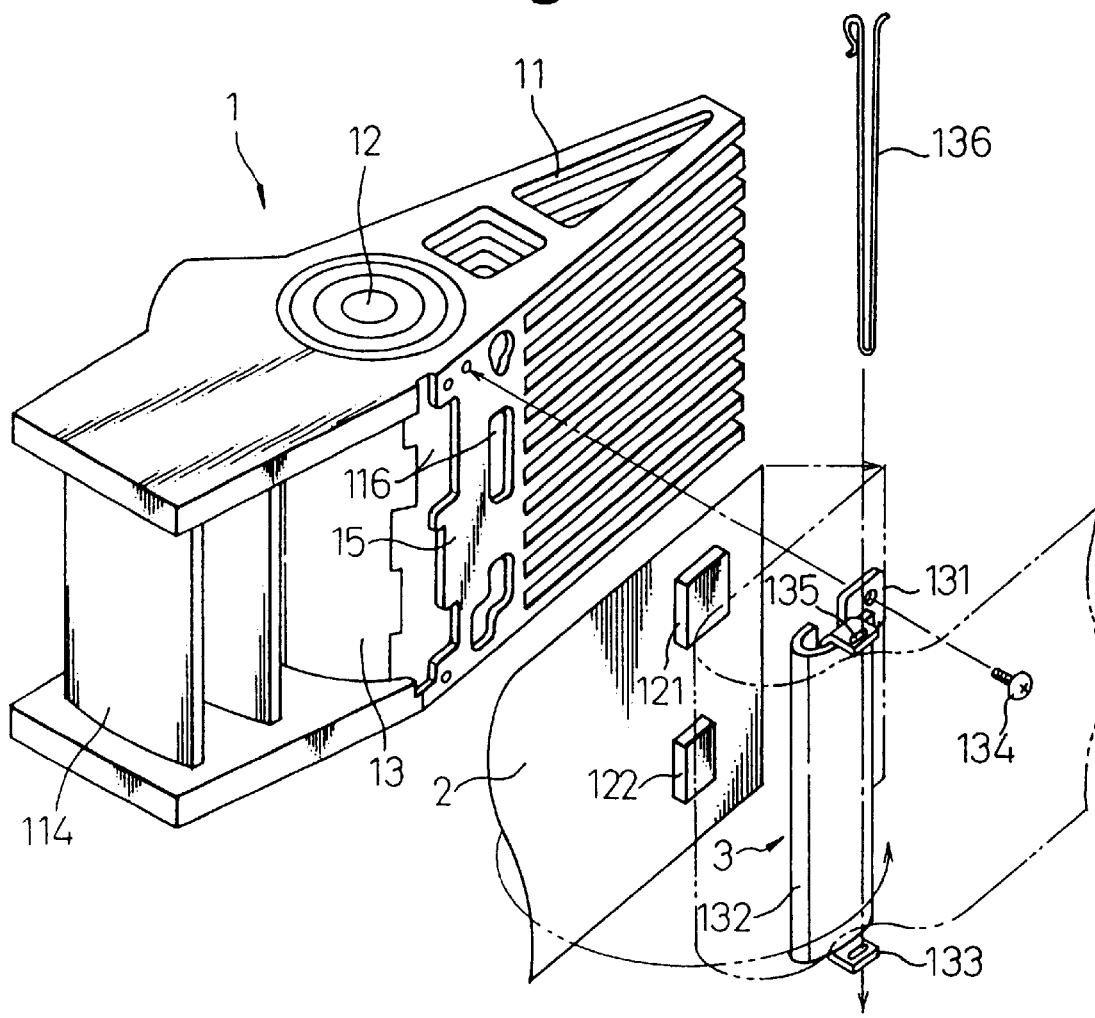
FIG. 14A is an assembly perspective view of a carriage and shows a construction example of a carriage structure according to the second embodiment of the present invention.

FIG. 14A shows only the portion of the carriage 1 constituting the actuator 4 of the magnetic disk device 10 shown in FIG. 13 when it is taken out. The carriage 1 comprises the arm portion 11 for mounting the head 7 at the distal end thereof, the carriage main body 13 equipped with the rotary shaft 12 and the coil fitting portion 114 for fitting the coil. In this embodiment, a part of the side surface of the carriage main body 13 is shaped into the flat surface portion 15 for fitting the flexible circuit board 2.

Figure 14B:
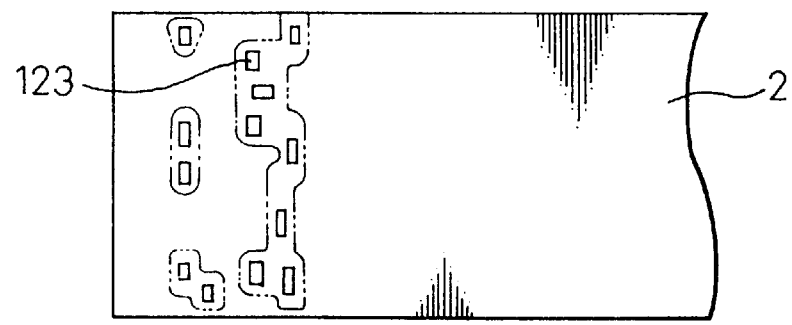
FIG. 14B is a side view showing the structure of a part of the back of the flexible circuit board shown in FIG. 14A.
Figure 15A:
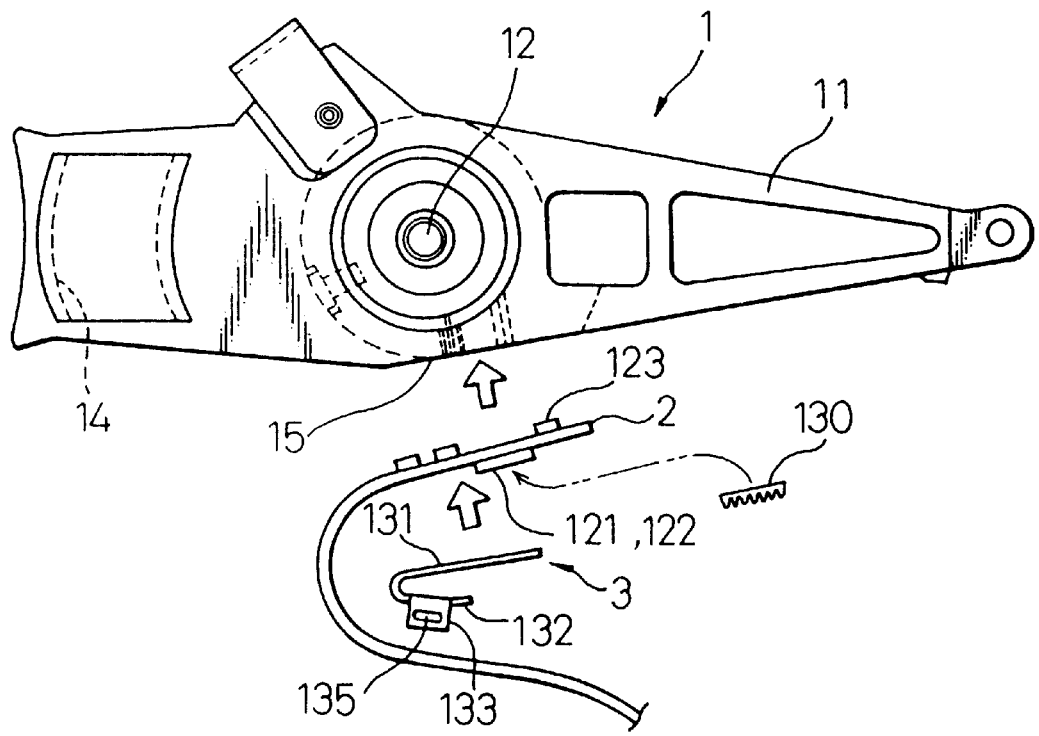
FIG. 15A is a plan view of the carriage having the structure shown in FIG. 14A.
Figure 15B:
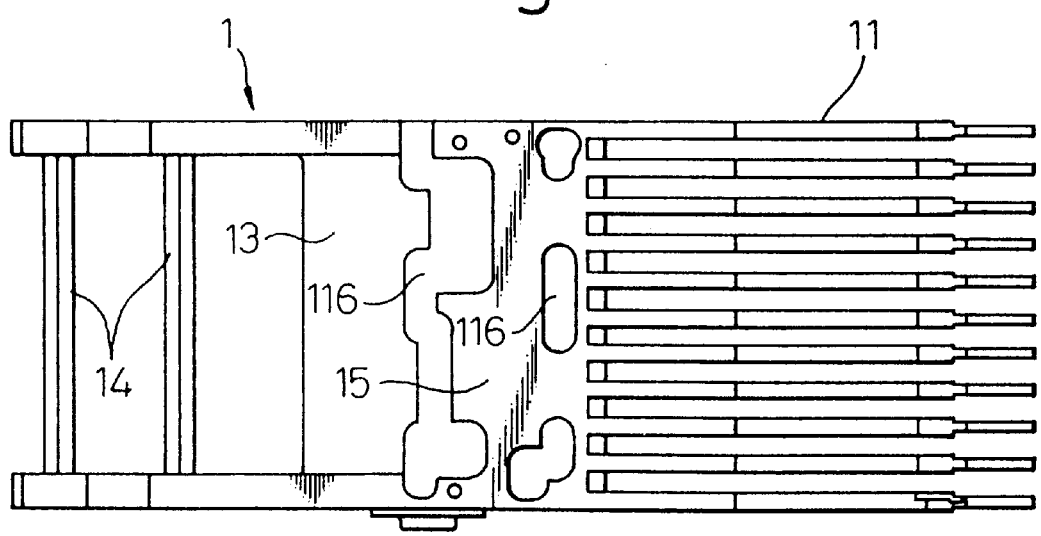
FIG. 15B is a side view of the carriage shown in FIG. 14A.

The flexible circuit board 2 fitted to the flat surface portion 15 of the carriage main body 13 is the double-face substrate, and a plurality of chip components 123 such as resistors and capacitors are packaged to the fitting surface of the carriage main body 13 of the flexible circuit board 2 to the flat surface portion 15 as shown in FIG. 14B. An accommodation groove 116 for accommodating the chip components 123 packaged to the flexible circuit board 2 is disposed on the flat surface portion 15 in such a manner as to correspond to the packaging positions of the chip components 123 on the flexible circuit board 2. FIG. 15B is a side view of the carriage 1 in which the accommodation grooves 116 are defined.

On the other hand, the head IC 121 for demodulating the signals from the head and the servo IC 122 are packaged to the surface (front surface) opposite to the fitting surface of the carriage main body 13 of the flexible circuit board 2 to the flat surface portion 15.

After the chip components 123 are packaged to the fitting surface side to the carriage 1 and the head IC 121 and the servo IC 122 are fitted to the front surface side of the flexible circuit board 2, this flexible circuit board 2 is fitted in the state where its distal end portion is fitted into the flat surface portion 15 of the carriage main body 13 while accommodating the chip components 123 in the accommodation groove 116. Thereafter, the flexible circuit board 2 is pushed by the fixing plate 3 and is fixed onto the flat surface portion 15 of the carriage main body 13.

The fixed plate 3 comprises the flat sheet portion 131 and the fold-back portion 132, and the flat sheet portion 131 is fixed to the carriage main body 13 by a screw 134. As shown in FIG. 15A, the fold-back portion 132 is formed by folding back the end portion of the flat sheet portion 131 positioned on the opposite side to the arm portion 11 of the carriage 1 in the direction spaced apart from the carriage 1. Flanges 133 are so disposed on both sides, and in proximity, of the free end portion of this fold-back portion 132 as to oppose each other, and a through-hole 135 is bored in each flange 133.

After the head IC 121 and the servo IC 122 are packaged to the front surface side and the chip components 123 are packaged to the back side, the flexible circuit board 2 is folded as indicated by a two-dot-chain line in FIG. 14A, and is extended along the fold-back portion 132 of the fixed plate 3. In this state, a support rubber, not shown, is inserted between the flanges 133 of the flexible circuit board 2, and an anchor pin 136 is inserted between the through-holes 135 of the opposed flanges 133 while pushing this support rubber, thereby fixing the flexible circuit board 2 between the fold-back portion 132 of the fixed plate 3 and the anchor pin 136.

A heat sink 130 for radiating heat can be fitted to the apexes of the head IC 121 and the servo IC 122 packaged to the surface side of the flexible circuit board 2 as shown in FIG. 15A.

Figure 16A:
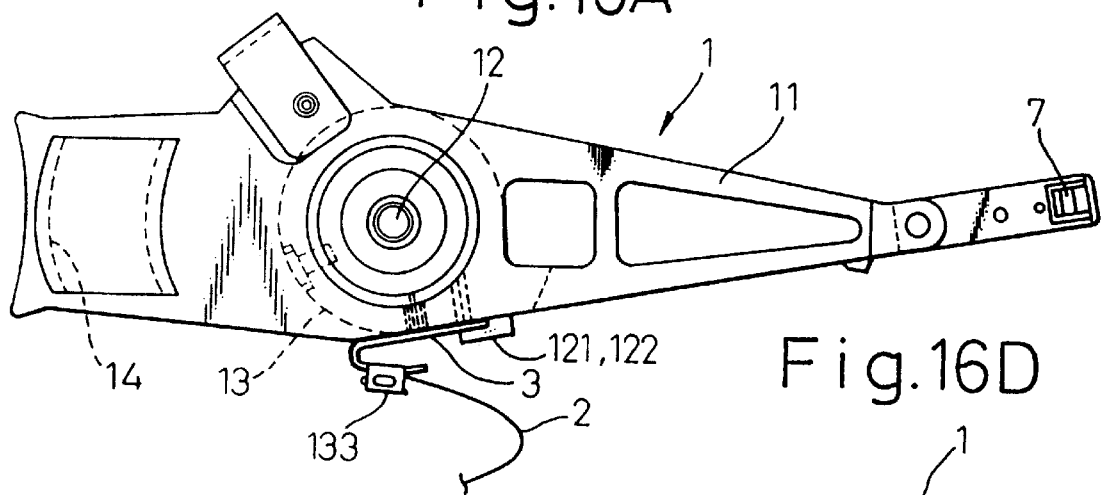
FIG. 16A is a plan view of showing the state where the flexible circuit board and a fixing plate are fixed to the carriage.
Figure 16D:
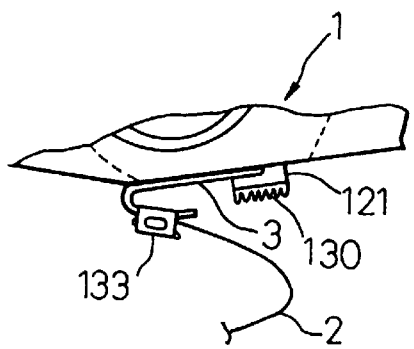
FIG. 16D is a plan view of the principal portions under the state where a heat sink is fitted to the head IC shown in FIG. 16A.
Figure 16B:
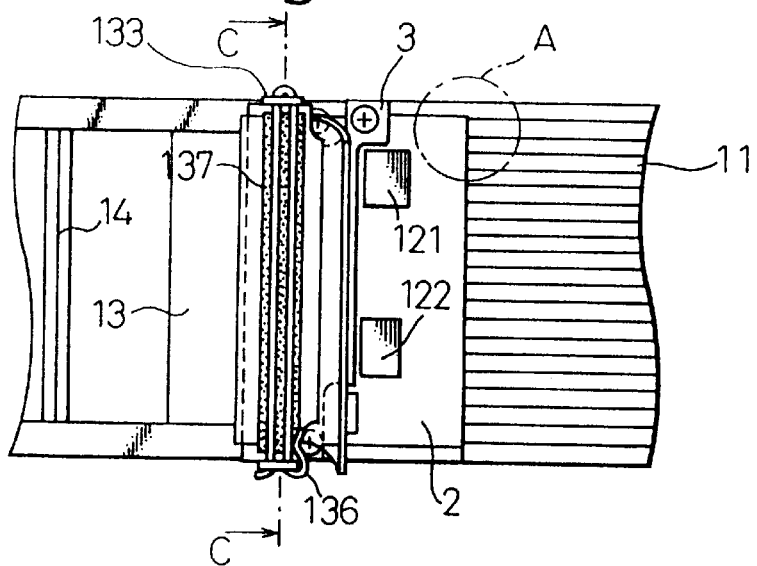
FIG. 16B is a side view of the principal portions shown in FIG. 16A.
Figure 16C:
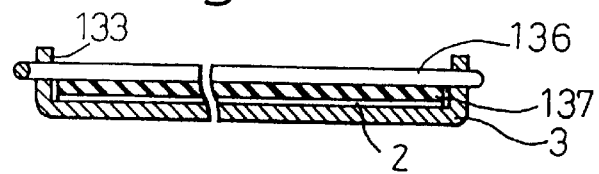
FIG. 16C is a sectional view taken along a line C—C of FIG. 16B.

FIG. 16A is a plan view showing the state where the flexible circuit board 2 and the fixed plate 3 are fixed to the carriage 1 through the fitting procedures described above, FIG. 16B is a side view of the principal portions of FIG. 16A and FIG. 16C is a sectional view taken along a line C—C of FIG. 16C. As shown in these drawings, the head IC 121 and the servo IC 122 are packaged to the surface side of the flexible circuit board 2, and the chip components 123 are packaged to the back side. In this state, the flexible circuit board 2 is fixed, in close contact, to the flat surface portion 15 of the carriage main body 13 by the fixed plate 3. The flexible circuit board 2 is fixed between the fold-back portion 132 of the fixed plate 3 and the anchor pin 136 through the support rubber 137.

FIG. 16D shows the state where the heat sink 130 is fitted to the head IC 121 and the servo IC 122 packaged to the surface side of the flexible circuit board 2. Flip chip packages for packaging the head IC 121 and the servo IC 122 to the surface side of the flexible circuit board 2 under the bare chip state will be explained using the head IC 121 by way of example.

Figure 17A:
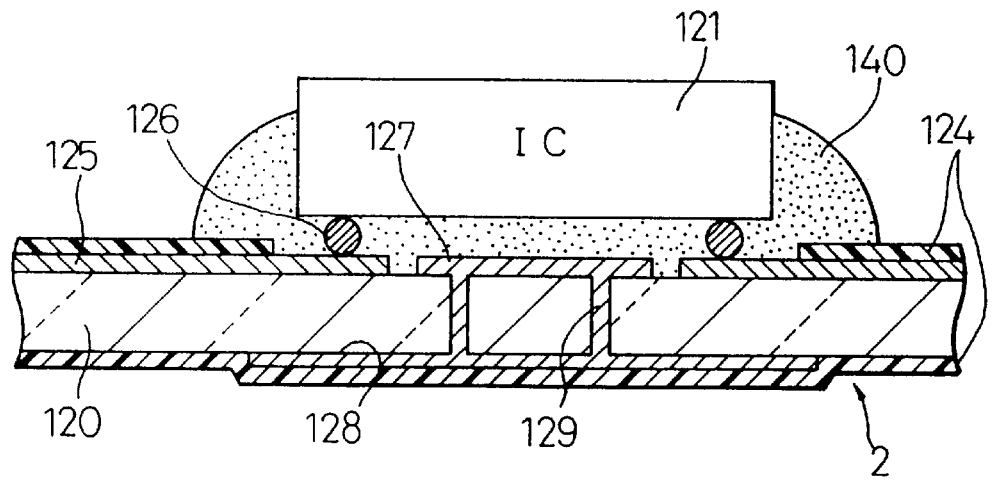
FIG. 17A is an explanatory view useful for explaining the state where a bare chip according to the present invention is packaged to a double-face circuit board by a flip chip packaging method.
Figure 17B:
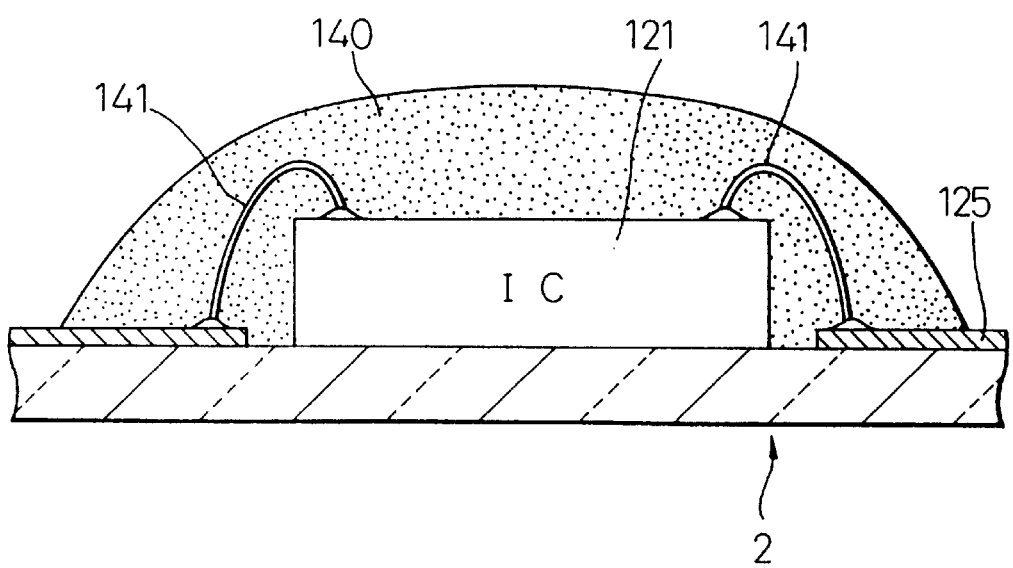
FIG. 17B is a schematic view showing the state where a conventional bare chip is packaged to a circuit board by a chip-on-board method, for the purpose of comparison.

FIG. 17A is an explanatory view useful for explaining the state where the bare chip of the head IC 121 is packaged to the surface side of the flexible circuit board 2 equipped with circuits on both sides thereof by the flip chip packaging method, and FIG. 17B is an explanatory view useful for explaining the bare chip of the head IC 121 to the surface side of the flexible circuit board 2 equipped with the circuit on only one surface thereof by the conventional chip-on-board method.

In FIG. 17A, reference numeral 120 denotes a base film of the flexible circuit board 2 made of a polyimide, or the like, and a circuit pattern 125 is disposed at a portion of the fitting position of the head IC 121 on this base film 120 corresponding to the output terminal of the head IC 121. A front mat pattern 127 is formed at a portion of the fitting position of the head IC 121 on the base film 120, which does not interfere with the output terminal of the head IC 121, and a back mat pattern 128 is formed on the back of the base film 120 at the portion corresponding to the front mat pattern 127. The front mat pattern 127 and the back mat pattern 128 are connected to each other by through-holes 129 penetrating through the base film 120. A cover film 124 is laminated on each of these front and back mat patterns 127 and 128.

The head IC 121, in the bare chip state where the output terminals are exposed below the device main body, is packaged onto the flexible circuit board 2 having the construction described above, by the flip chip packaging method. According to this flip chip packaging, the output terminals are exposed below the device main body, and are electrically and directly soldered to the circuit pattern 125 through bumps 126. The periphery of the head IC 121 is covered with a resin 140. Therefore, the packaging space of the head IC 121 can be reduced, and the components can be concentratedly packaged.

When the bare chip head IC 121 is packaged onto the flexible circuit board 2 by using the conventional surface packaging technology in contrast to such a flip chip packaging technology, the bare chip head IC 121 must be fitted while its output terminals are exposed on the upper side as shown in FIG. 17B. The output terminals on the upper surface of this head IC 121 are connected to the circuit pattern 125 on the flexible circuit board 2 by gold wires 141, and the peripheral portion of the head IC 121 inclusive of this gold wire 141 is covered with the resin 140. As a result, when the bare chip head IC 121 is packaged onto the flexible circuit board 2 by using the conventional surface packaging technology, the occupying area of the head IC 121 on the flexible circuit board 2 becomes great, so that it becomes difficult to concentratedly package the components on the flexible circuit board 2.

Figure 18A:
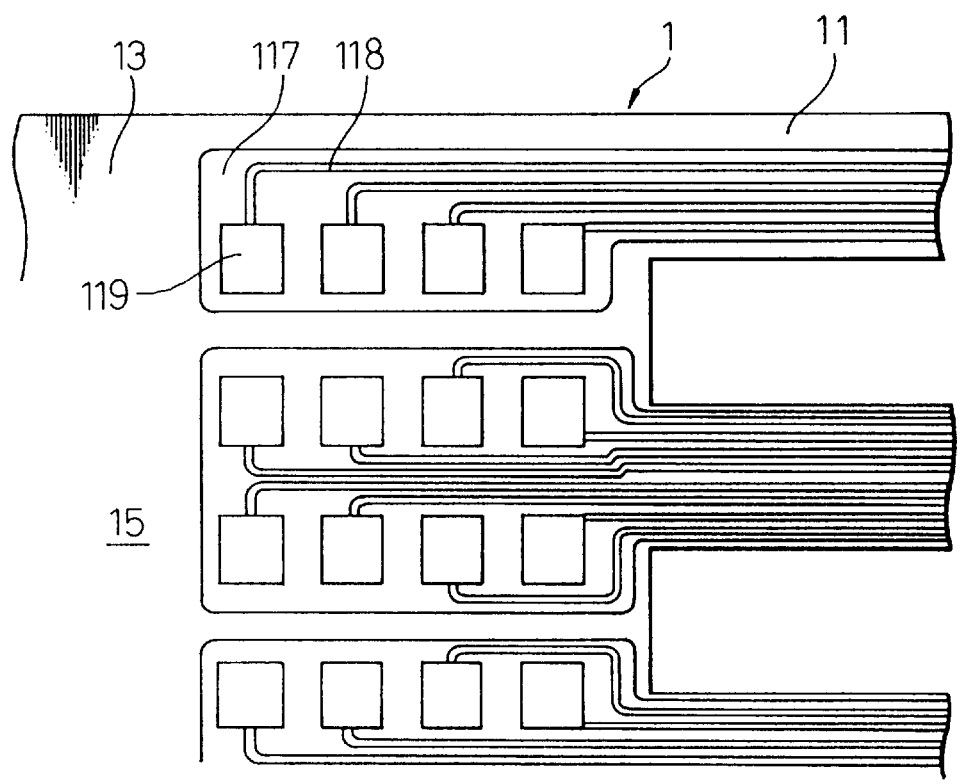
FIG. 18A is a partial enlarged side view showing the state where the flexible circuit board at the portion A in FIG. 16B is peeled.
Figure 18B:
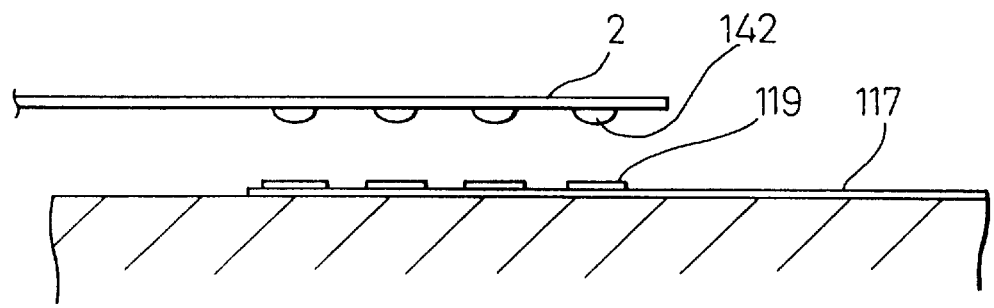
FIG. 18B is a partial enlarged side sectional view showing the state where the flexible circuit board is connected to pads to be connected to the head shown in FIG. 18A.

FIG. 18A is a partial enlarged side view showing the state where the flexible circuit board 2 of the A portion in FIG. 16B is peeled, and explains the connection between the flexible circuit board 2 and the head in this embodiment. The relay flexible circuit board 117 for exchanging the signals with each head disposed at the distal end of the arm portion 11 is disposed on the side surface of the arm portion 11 of the carriage 1. Four pads 119 are disposed at the proximal end portion of each delay flexible circuit board 117, and are connected to the head, not shown, by the circuit pattern 118. Since the head is the composite head equipped with the inductive head and the MR head in this embodiment, four pads 119 and four circuit patterns 118 are disposed, respectively.

A contact 142 corresponding to each pad 119 of the relay flexible circuit board 117 is disposed at the distal end portion of the flexible circuit board 2 explained with reference to FIGS. 14A to 17A, for the relay flexible circuit board 117 having the construction described above as shown in FIG. 18B. When the flexible circuit board 2 is superposed with the flat surface portion 15 of the carriage main body 13, the flexible circuit board 2 is connected to the relay flexible circuit board 117.

Figure 19:
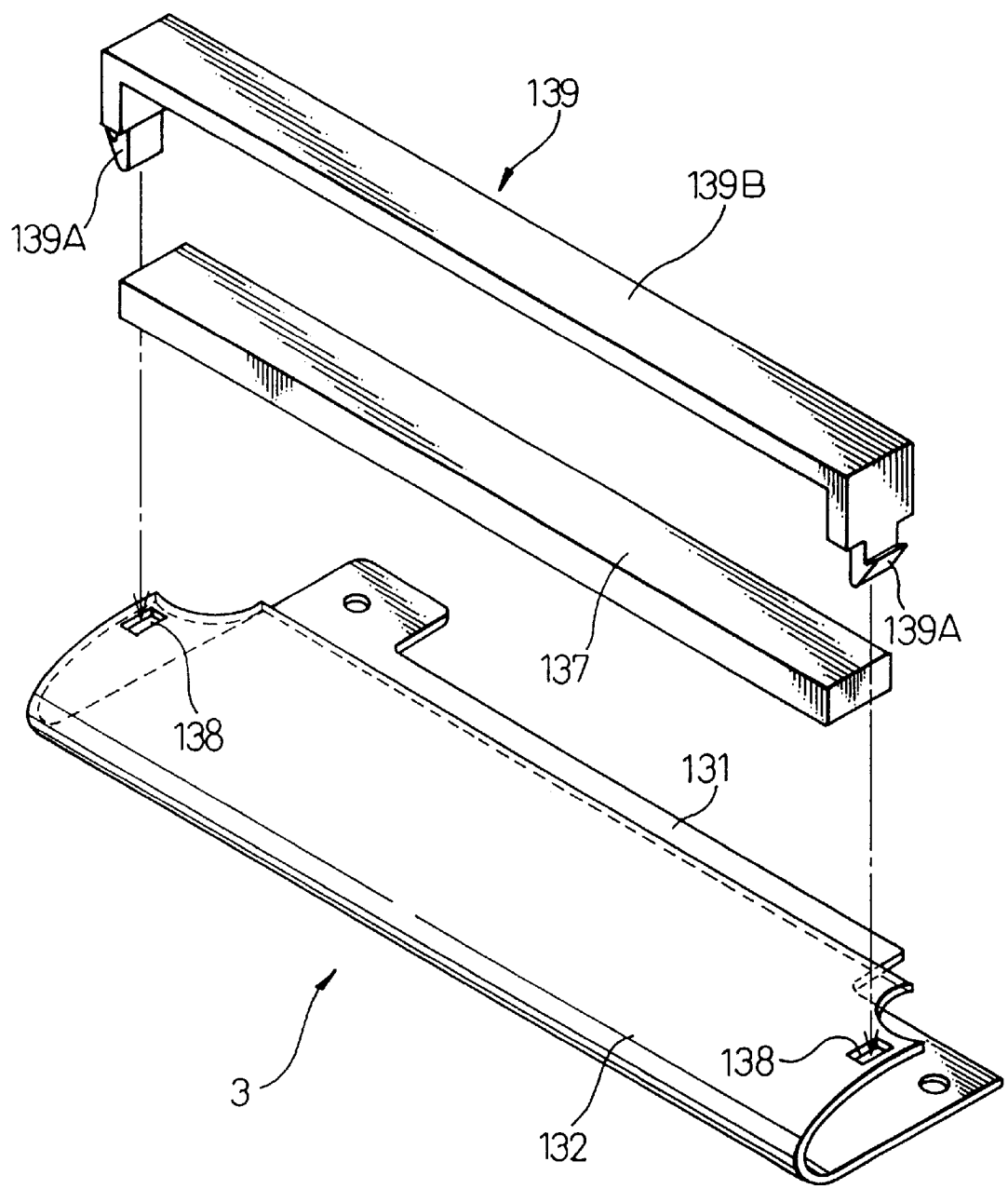
FIG. 19 is an assembly perspective view showing another structural example of the fixing plate shown in FIG. 14A.

FIG. 19 is an assembly perspective view showing another example of the structure of the fixed plate 3 for supporting the flexible circuit board 2 shown in FIG. 14A. In the example shown in FIG. 14A, the flanges 133 are disposed at the distal end portion of the fold-back portion 132 of the fixed plate 3 but in this example, through-holes 138 are formed at the positions at the distal end portion of the fold-back portion 132 of the fixed plate 3 corresponding to the positions of the flanges 133 described above. An anchor portion 139A of a gate-shaped snap 139 is fitted into each through-hole 138, and a support rubber 137 is inserted between the transverse bar 139B of the gate-shaped snap 139 and the fold-back portion 132 of the fixed plate 3. In this example, the flexible circuit board 2 is bent along the fold-back portion 132 of the fixed plate 3 and is then positioned by the gate-shaped snap 139 while interposing the support rubber 137.

Though the carriage structure according to the second embodiment has thus been described using the example of the magnetic disk device, this carriage structure can be likewise applied to other disk devices such as an optical disk. The carriage structure according to the second embodiment provides the following advantages.

(1) The head IC 121 as the control IC of the bare chip and the servo IC 122 are packaged to the connection portion of the flexible circuit board 2 for taking out the head signals with the carriage 1 by the flip chip packaging method, and other chip components 123 are packaged by the surface packaging technology. Therefore, the control IC and the chip components can be concentratedly and integratedly mounted to the connection portion of the flexible circuit board 2 with the carriage 1.

(2) The flexible circuit board 2 uses the double-face wiring board, the chip components 123 are packaged on the flexible circuit board 2 on the side of the carriage 1, the control IC is packaged on the opposite surface, and the accommodation groove 116 for avoiding the interference with the chip components 123 is disposed on the flat surface portion 15 of the carriage 1 as the fitting surface of the flexible circuit board 2. Therefore, the flexible circuit board 2 can be fitted to the carriage 1 under the adhesion state.

(3) The surface mat pattern 127 is disposed on the packaging surface of the control ICs 121 and 122 on the flexible circuit board 2 in such a manner as to extend below the control ICs 121 and 122 in the state where it does not interfere with their output terminals. Therefore, heat radiation of the control ICs 121 and 122 can be accomplished. This heat radiation effect can be further improved by disposing the back mat pattern 128 which extends on the back side of the control ICs 121 and 122 and does not interfere with the output terminals of the output terminals of the chip components 123, and connecting this back mat pattern 128 to the surface mat pattern 127 by the through-holes 129 at the positions below the control ICs 121 and 122. The heat radiation effect can also be improved further by fitting the heat sink 130 for heat radiation on the upper surface of the control ICs 121 and 122.

(4) The fixed plate 3 for fixing the flexible circuit board 2 onto the carriage 1 under the push state is fitted to the external side of the flexible circuit board 2, the fold-back portion 132 bent and folded outward is formed at one of the ends of this fixed plate, and the anchor members for the flexible circuit board 2 are disposed at both opposed positions on both sides and in the proximity of the free end of the fold-back portion 132. In this way, the withdrawing direction of the flexible circuit board 2 can be defined.

As described above, according to the carriage structure of the second embodiment, the flip chip packaging method is used afresh for the connection portion of the flexible circuit board to the actuator of the disk device. Therefore, the head IC, the servo IC and the peripheral circuit can be packaged, in the integrated state, in the space of the connection portion between the flexible circuit board and the carriage while heat radiation is taken into consideration. As a result, the noise at the time of read/write of the head can be reduced, and the transfer rate can be improved.

What is claimed is:

1. In a disk device including, on a base, at least one recording disk rotated by a spindle motor, a carriage equipped with heads for executing read/write operations with said recording disk and a voice coil motor for driving said carriage, a structure of said carriage comprising:

a flat surface portion disposed on the side surface of a main body of said carriage;

an anchor member fixed to said flat surface portion, and having first and second faces;

a dual-faced flexible circuit board having first and second generally planar component mounting surfaces and signal lines connected to each of said heads for communicating signals from the heads to a distal end portion of said flexible circuit board, said first planar mounting surface having a first connection portion mounted to said first face of said anchor, and said first planar mounting surface having a second connection portion mounted to said second face of said anchor member;

a first electronic component mounted integrally and concentratedly to said first planar mounting surfaces;

a second electronic component mounted integrally and concentratedly to said second planar mounting surface;

wherein said anchor member acts as a heat sink for said first and second electronic components.

2. A structure of a carriage according to claim 1, wherein said first and second electronic components are packaged to said flexible circuit board on the side of said carriage, and first and second electronic component accommodation grooves for avoiding interference with said first and second electronic components on said flexible circuit board are disposed on a fitting surface of said carriage to said flexible circuit board.

3. A structure of a carriage according to claim 2, further comprising:

a mat surface on said dual-faced flexible circuit board at a location passing below said second electronic component and not interfering with output terminals of said second electronic component disposed on a package surface of said second electronic component; and said first component includes at least one servo position control component.

4. A structure of said carriage according to claim 3, wherein a back mat pattern passing at the back of said control second electronic component and not interfering with the output terminals of said second electronic component is disposed on the package surface of said second electronic components on said flexible circuit board, and said back mat pattern is connected to said front mat pattern by at least one through-hole below a control second electronic component.

5. A structure of said carriage according to claim 4, wherein a fold-back portion bent and folded back in a direction departing from said carriage is disposed at one of the ends of said anchor member, flanges having a pin insertion hole are formed at opposed positions on both sides, and in the proximity of, the free end of said fold-back portion, and said flexible circuit board is bent and folded along said fold-back portion and is then positioned by a pin inserted between both of said flanges.

6. A structure of said carriage according to claim 4, wherein a fold-back portion, bent and folded back in a direction departing from said carriage, is formed at one of the ends of said anchor member, through-holes are formed at opposed positions on both sides, and in the proximity, of a free end of said fold-back portion, and said flexible circuit board is bent and folded back along said fold-back portion and is positioned by a gate-shaped snap anchored to said through-hole.

7. A structure of said carriage according to claim 1, wherein a heat sink for radiating heat is fitted to the upper surface of said second electronic component.

8. A structure of a carriage according to claim 1, wherein one of said first electronic component and said second electronic component is packaged to a connection portion of said flexible circuit board with said carriage by a flip chip packaging method while the other of said first electronic component and said second electronic component is packaged by a surface packing technology so that said first electronic component and said second electronic component are mounted integrally and concentratedly to the connection portion of said flexible circuit board to said carriage.

9. A structure of a carriage according to claim 8, wherein said first electronic component is a head signal processing component for processing the signals from the heads, and said second electronic component is a servo position control component for controlling the position of said head.

* * * * *

UNITED STATES PATENT AND TRADEMARK OFFICE
CERTIFICATE OF CORRECTION

PATENT NO. : 5,995,321
DATED : November 30, 1999
INVENTOR(S) : Ishida

It is certified that error appears in the above-indentified patent and that said Letters Patent is hereby corrected as shown below:

On the Face of the Patent:

Under "[56] References Cited U.S Patent Documents" please delete "557,050 10/1896" and insert --5,570,250 10/1996-- therefor In the Claims:

In claim 4, line 7, delete "said" and insert --a-- therefor

Signed and Sealed this

Seventeenth Day of April, 2001

*Attest:*

NICHOLAS P. GODICI

*Attesting Officer*   Acting Director of the United States Patent and Trademark Office